United States Patent
Masuoka et al.

(10) Patent No.: US 9,536,892 B2
(45) Date of Patent: Jan. 3, 2017

(54) PILLAR-SHAPED SEMICONDUCTOR MEMORY DEVICE AND METHOD FOR PRODUCING THE SAME

(71) Applicant: Unisantis Electronics Singapore Pte. Ltd., Singapore (SG)

(72) Inventors: Fujio Masuoka, Tokyo (JP); Nozomu Harada, Tokyo (JP)

(73) Assignee: UNISANTIS ELECTRONICS SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 15/219,924

(22) Filed: Jul. 26, 2016

(65) Prior Publication Data

US 2016/0336331 A1    Nov. 17, 2016

Related U.S. Application Data

(63) Continuation of application No. PCT/JP2014/060983, filed on Apr. 17, 2014.

(51) Int. Cl.
*H01L 27/115* (2006.01)

(52) U.S. Cl.
CPC ..... *H01L 27/1157* (2013.01); *H01L 27/11573* (2013.01); *H01L 27/11582* (2013.01); *H01L 27/11524* (2013.01)

(58) Field of Classification Search
CPC ............... H01L 27/11524; H01L 27/1157
USPC ......................................................... 257/321
See application file for complete search history.

(56) References Cited

U.S. PATENT DOCUMENTS

| | | | |
|---|---|---|---|
| 8,189,371 B2 | 5/2012 | Katsumata et al. | |
| 9,450,023 B1* | 9/2016 | Konevecki | H01L 27/2454 |
| 2002/0154556 A1 | 10/2002 | Endoh et al. | |
| 2007/0252201 A1 | 11/2007 | Kito et al. | |

(Continued)

FOREIGN PATENT DOCUMENTS

| | | |
|---|---|---|
| JP | 02-188966 A | 7/1990 |
| JP | 04-79369 A | 3/1992 |

(Continued)

OTHER PUBLICATIONS

Stewart, A. et al., "Microtopography of Surface Eroded by Ion-Bombardment", *Journal of Material Science*, vol. 4, 1969, pp. 56-69.

(Continued)

*Primary Examiner* — George Fourson, III
(74) *Attorney, Agent, or Firm* — Brinks Gilson & Lione

(57) ABSTRACT

A pillar-shaped semiconductor memory device includes an i-layer substrate, a silicon pillar, a tunnel insulating layer, a data charge storage insulating layer, a first interlayer insulating layer, a second interlayer insulating layer, and word-line conductor layers separated by third interlayer insulating layers. The tunnel insulating layer, the data charge storage insulating layer, the first interlayer insulating layer, and the second interlayer insulating layer are formed so as to surround an outer peripheral portion of a side surface of the silicon pillar. The word-line conductor layers and the third interlayer insulating layers are formed so as to surround an outer peripheral portion of a side surface of the second interlayer insulating layer in a direction perpendicular to a surface of the i-layer substrate.

20 Claims, 30 Drawing Sheets

(56) References Cited

U.S. PATENT DOCUMENTS

| | | | |
|---|---|---|---|
| 2010/0327340 A1 | 12/2010 | Oota et al. | |
| 2011/0287612 A1* | 11/2011 | Lee | H01L 27/11578 438/478 |
| 2012/0068242 A1* | 3/2012 | Shin | H01L 27/11582 257/315 |
| 2012/0119287 A1 | 5/2012 | Park et al. | |
| 2013/0119531 A1 | 5/2013 | Tanaka et al. | |
| 2014/0063938 A1* | 3/2014 | Oh | H01L 27/11524 365/185.02 |
| 2014/0367762 A1* | 12/2014 | Tian | H01L 29/66825 257/321 |
| 2015/0054058 A1* | 2/2015 | Seol | H01L 29/42332 257/324 |
| 2015/0155297 A1* | 6/2015 | Eom | H01L 27/11582 438/268 |
| 2015/0214239 A1* | 7/2015 | Rhie | H01L 27/11556 257/321 |
| 2015/0294724 A1* | 10/2015 | Nam | G11C 16/10 365/185.11 |
| 2016/0099250 A1* | 4/2016 | Rabkin | H01L 27/11582 257/66 |
| 2016/0163725 A1* | 6/2016 | Kamiya | H01L 21/0206 257/321 |
| 2016/0204117 A1* | 7/2016 | Liu | H01L 29/66825 257/324 |
| 2016/0204122 A1* | 7/2016 | Shoji | H01L 27/11582 257/324 |
| 2016/0268270 A1* | 9/2016 | Masuoka | H01L 29/792 |

FOREIGN PATENT DOCUMENTS

| | | |
|---|---|---|
| JP | 2003-092366 A | 3/2003 |
| JP | 2011-009409 A | 1/2011 |
| JP | 2012-109571 A | 6/2012 |
| JP | 2013-069930 A | 4/2013 |
| JP | 2013-128083 A | 6/2013 |

OTHER PUBLICATIONS

Ting, C. et al., "Study of Planarized Sputter-Deposited SiO2", *J. Vac. Sci. Technol.*, vol. 15, No. 3, May/Jun. 1978, pp. 1105-1112.

International Search Report in corresponding International Application No. PCT/JP2014/060983, dated May 20, 2014, 10 pages.

English language translation of International Preliminary Report on Patentability in corresponding International Application No. PCT/JP2014/060983, dated Oct. 27, 2016, 6 pages.

* cited by examiner

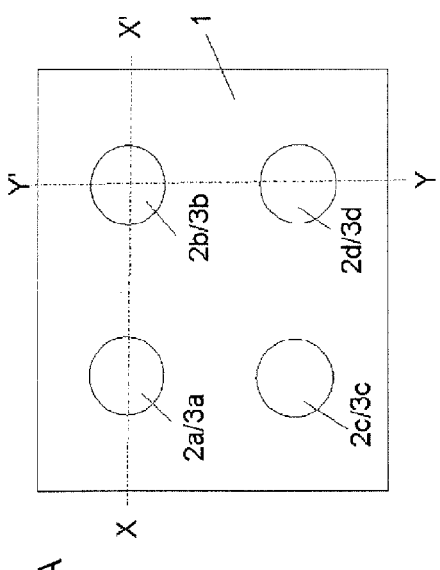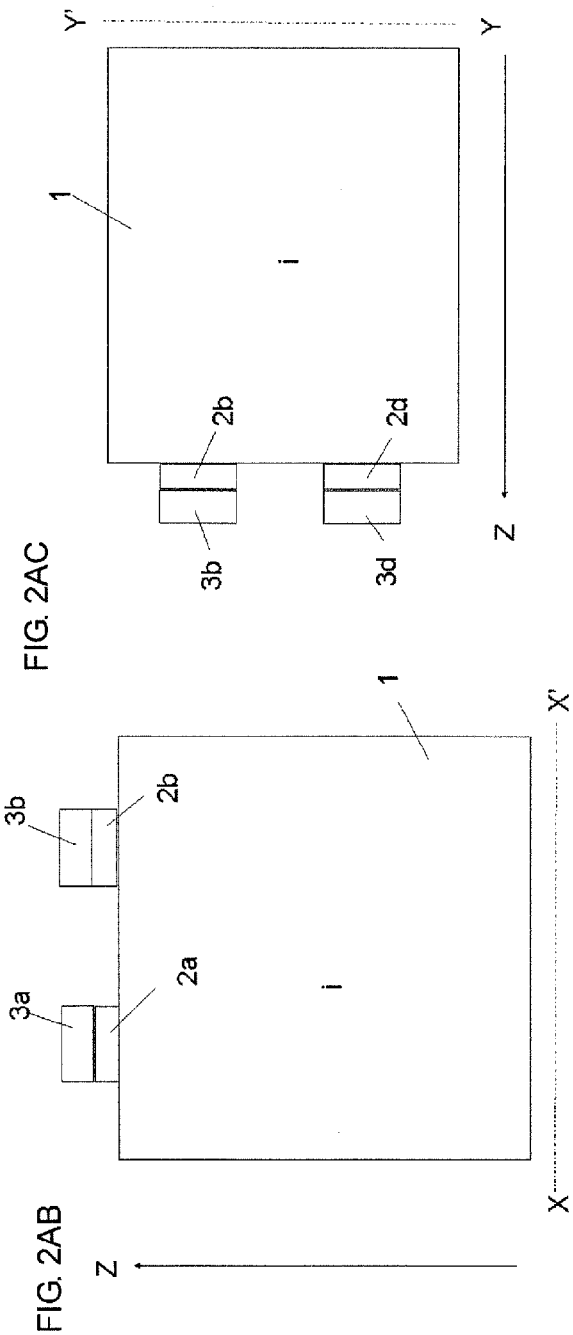

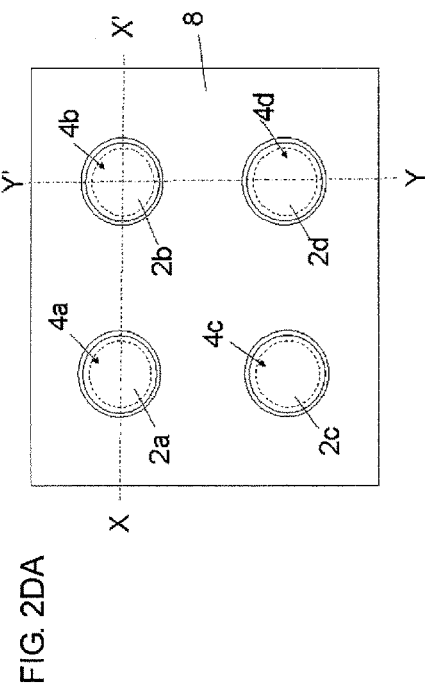
FIG. 2DA
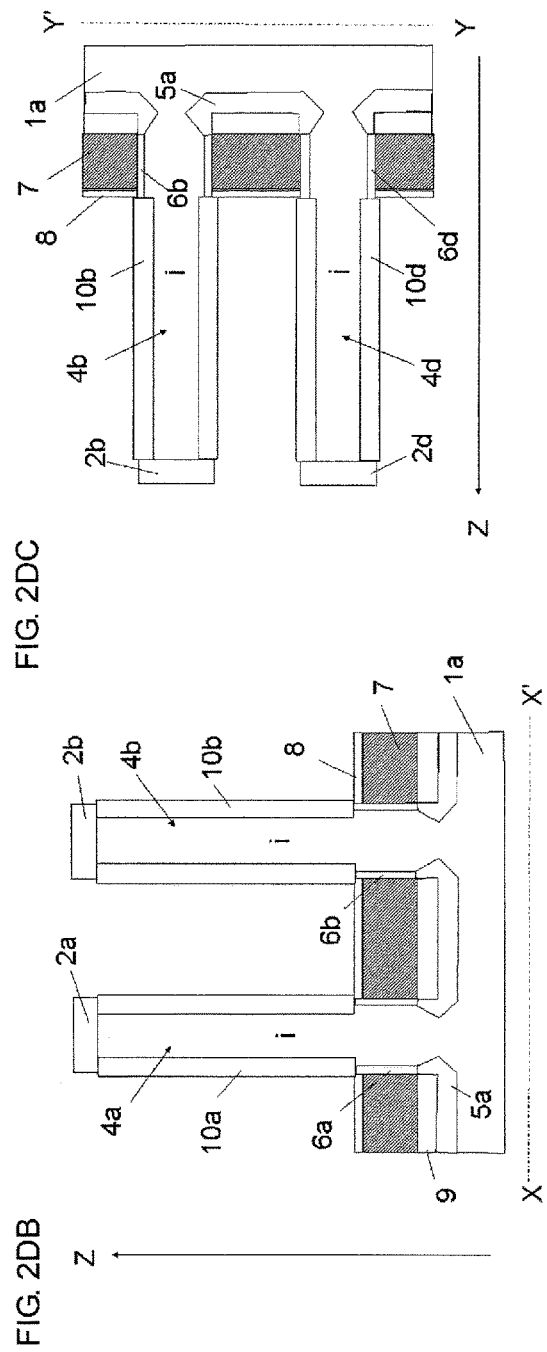
FIG. 2DB
FIG. 2DC

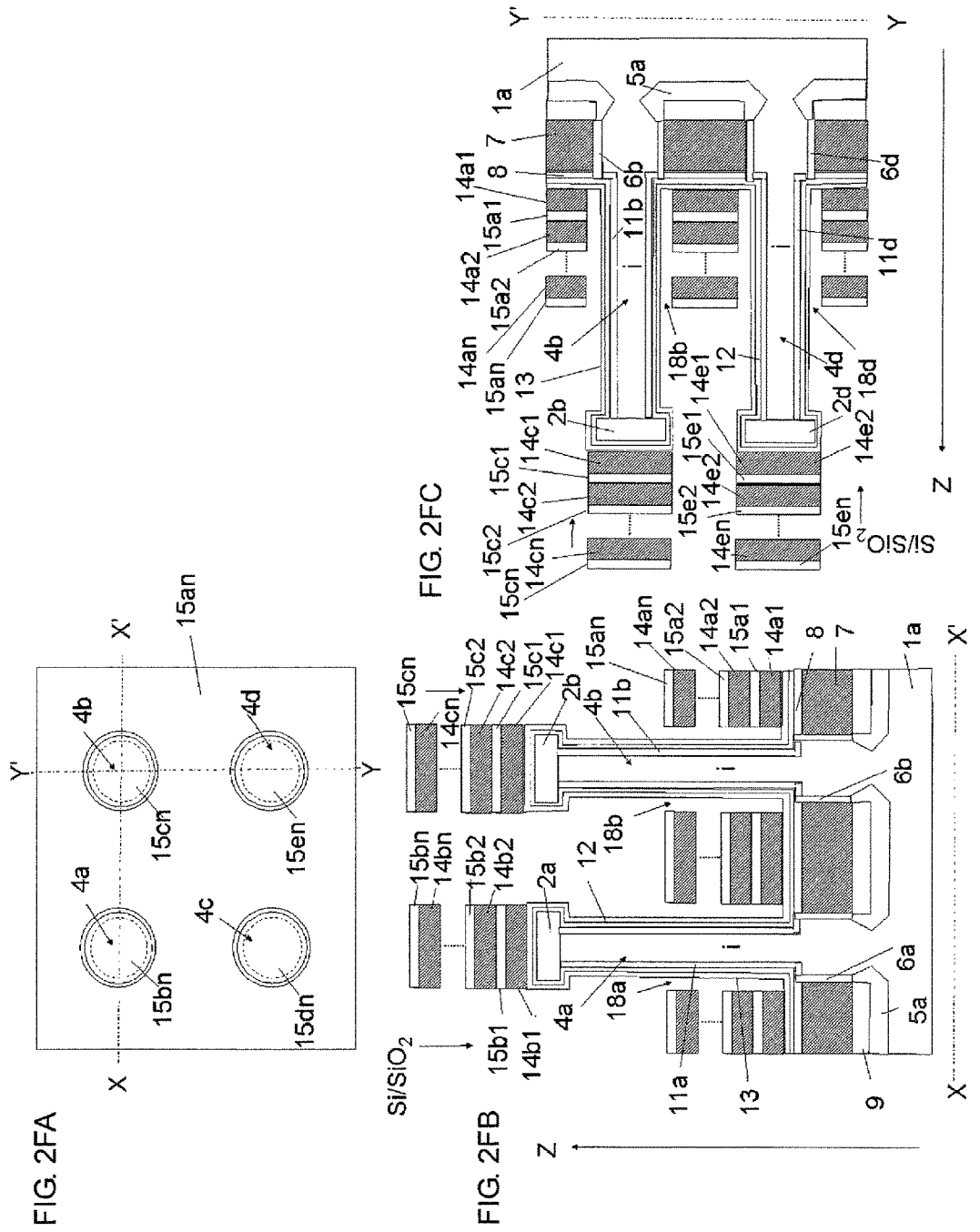

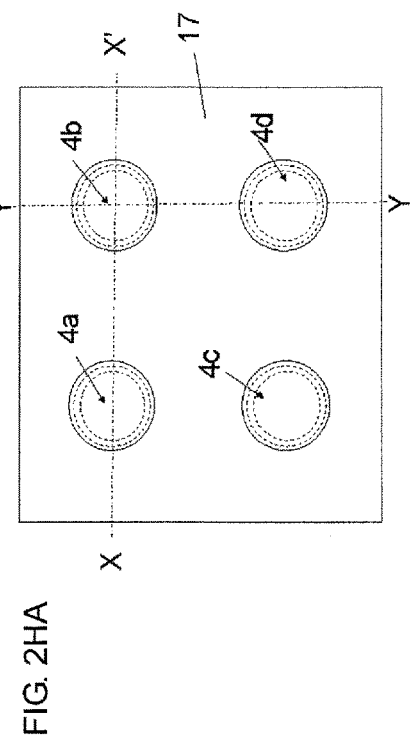
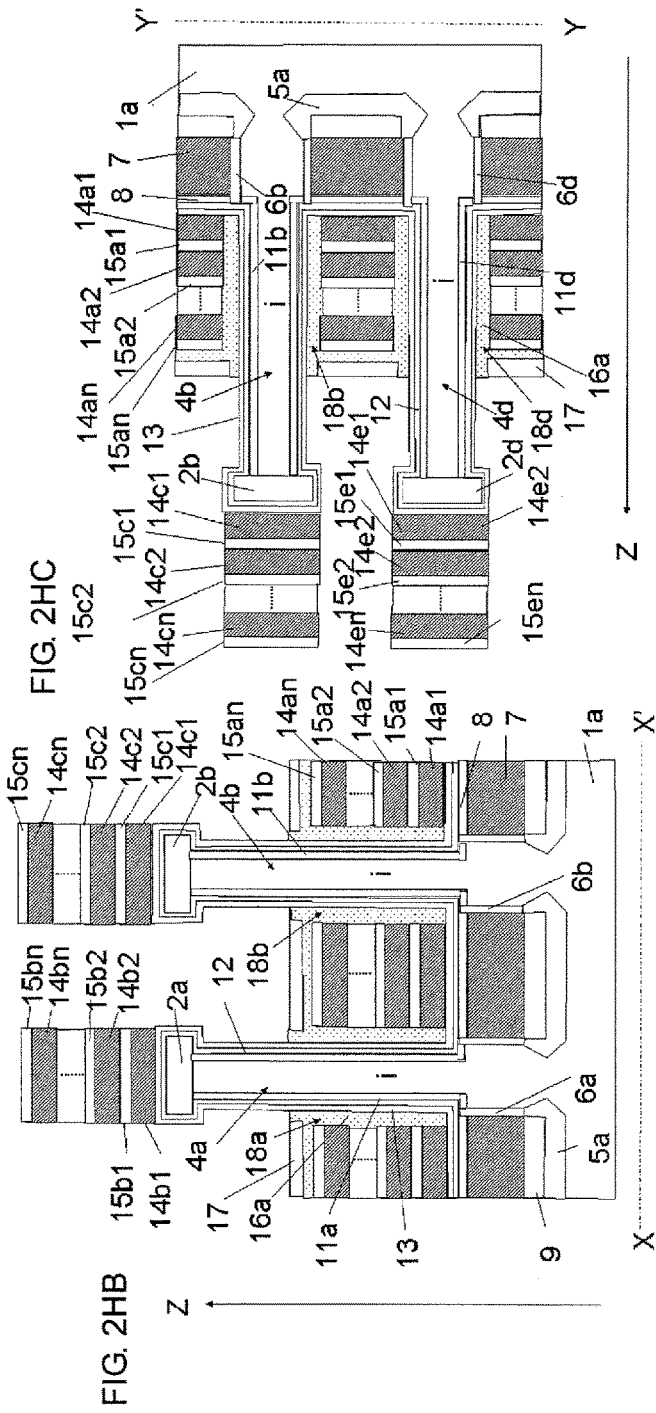
FIG. 2HA
FIG. 2HB
FIG. 2HC

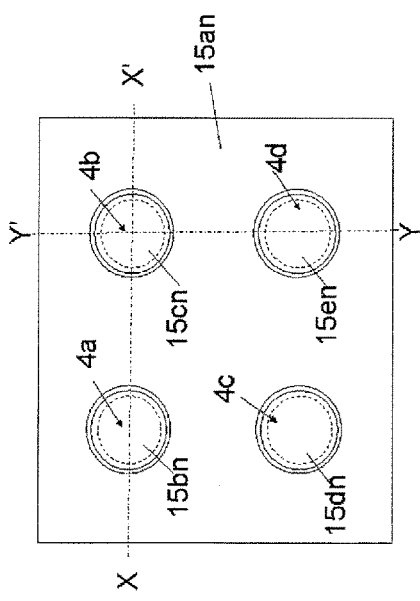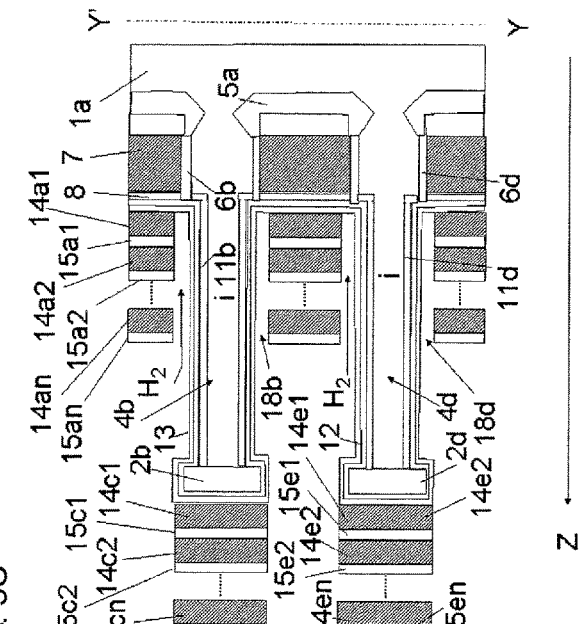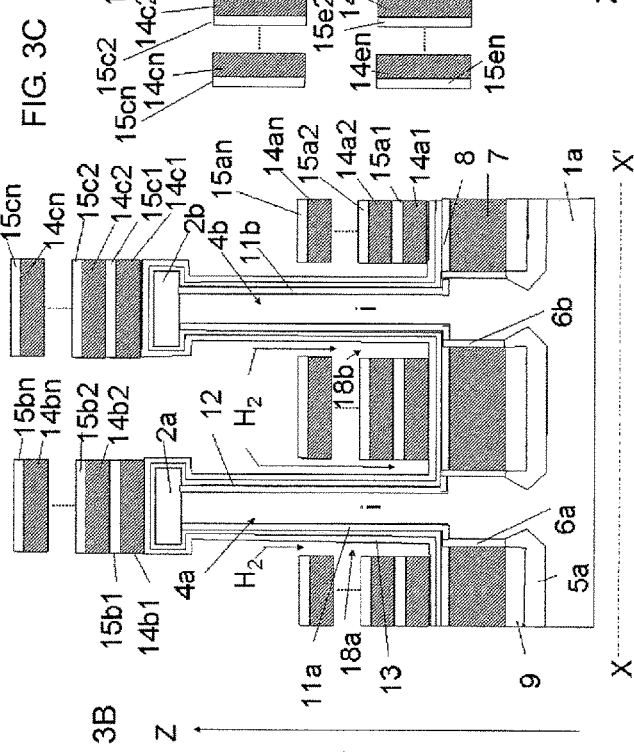

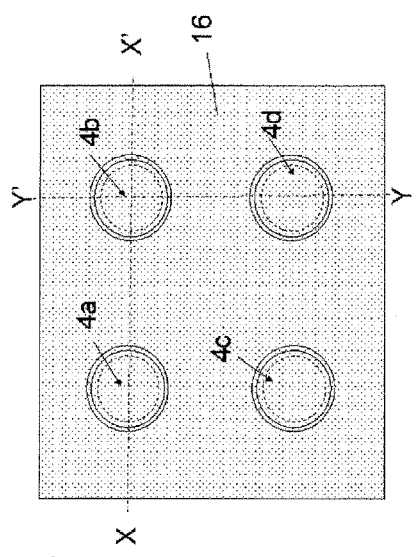
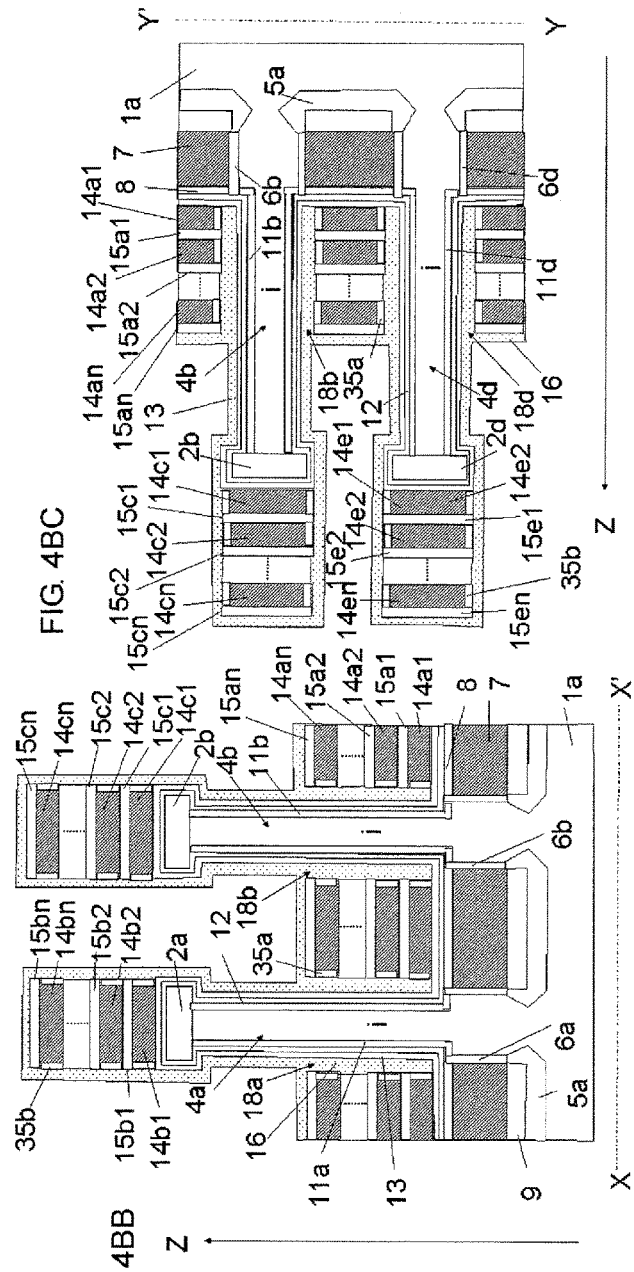
FIG. 4BA
FIG. 4BB
FIG. 4BC

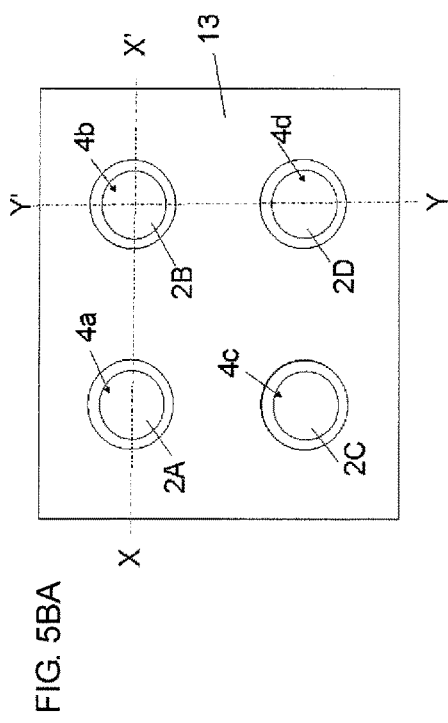
FIG. 5BA
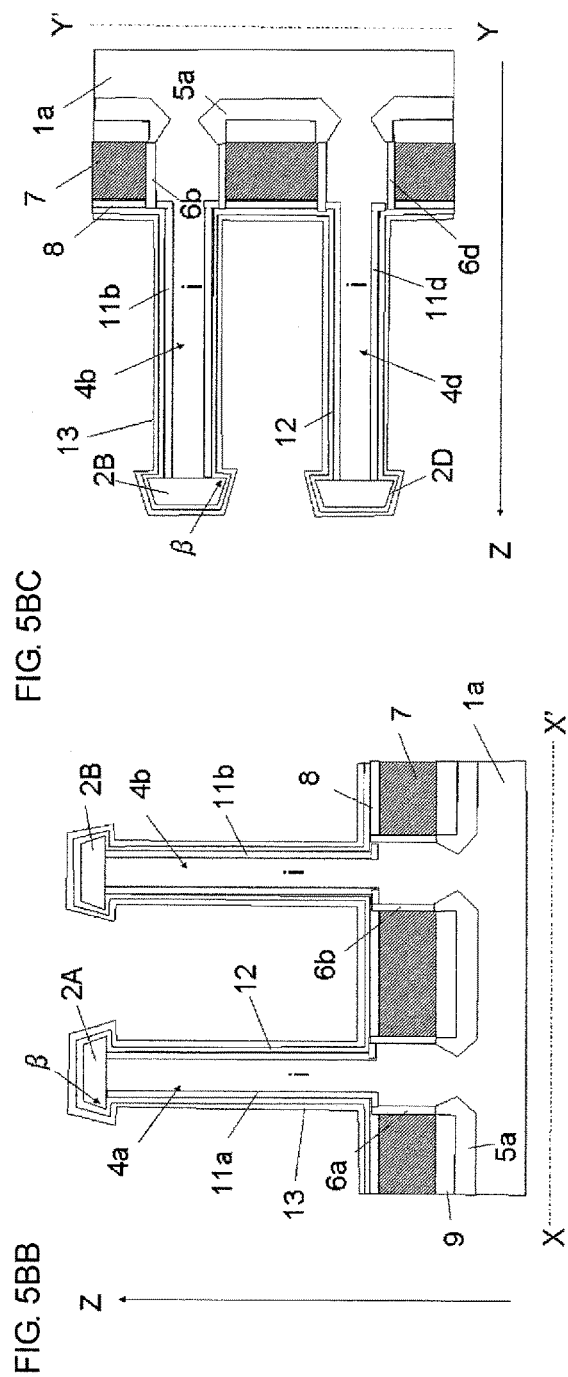
FIG. 5BC
FIG. 5BB

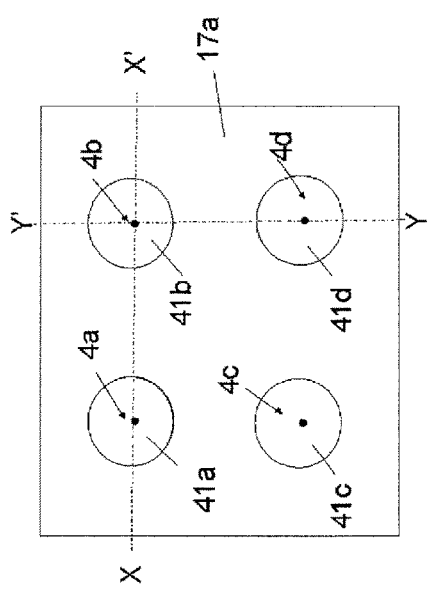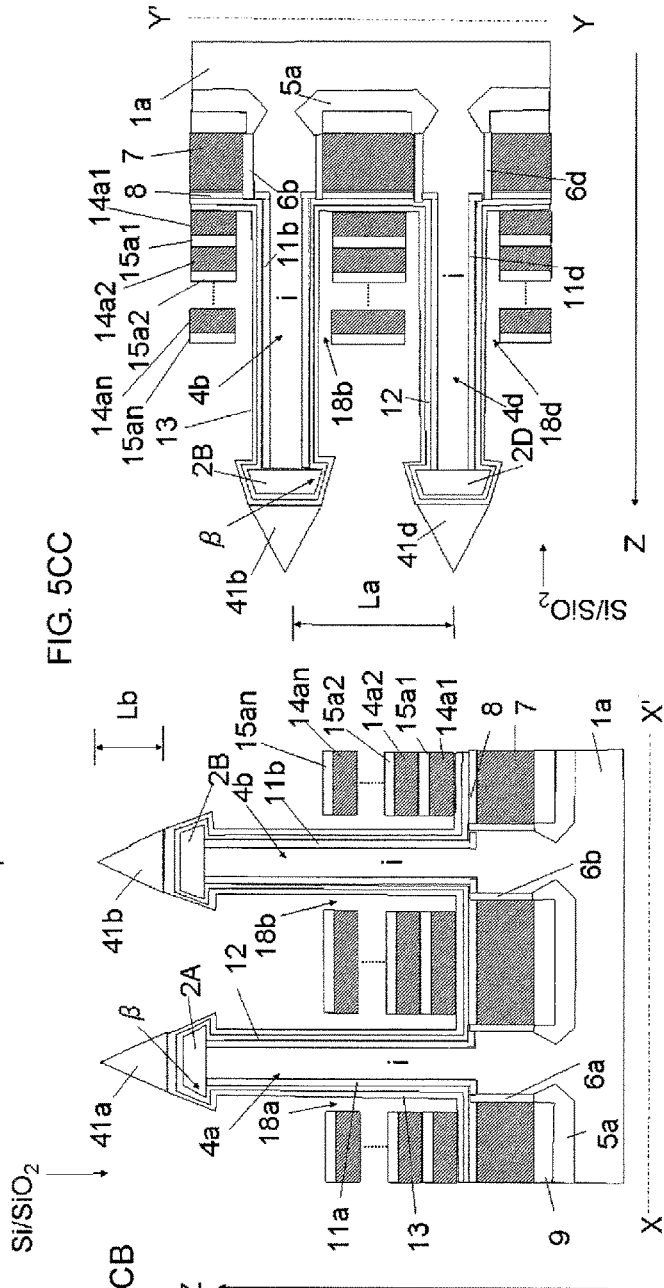
FIG. 5CA
FIG. 5CB
FIG. 5CC

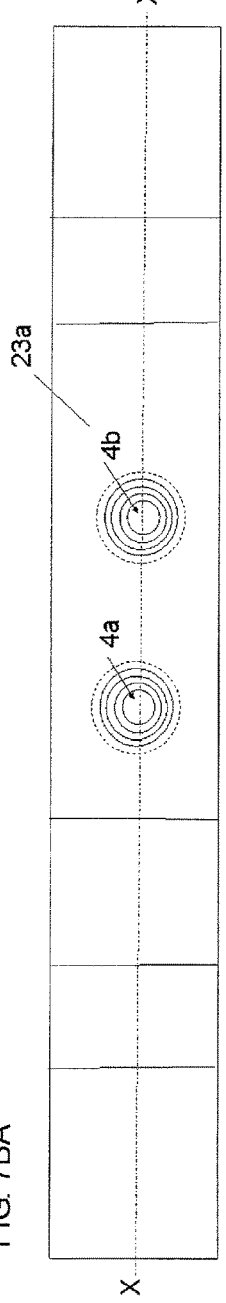
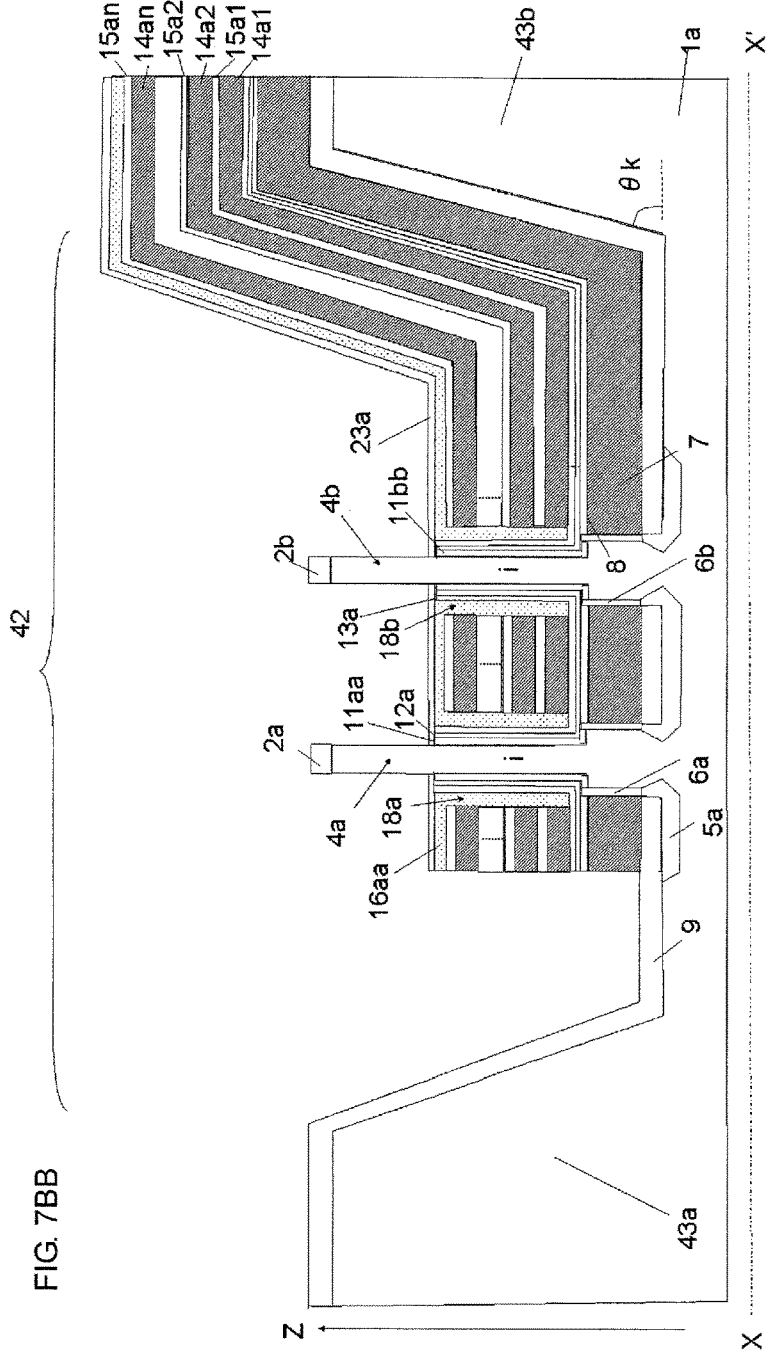
FIG. 7BA
FIG. 7BB

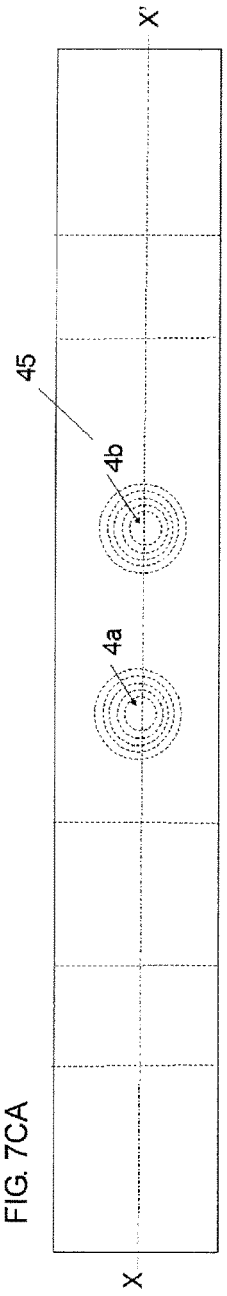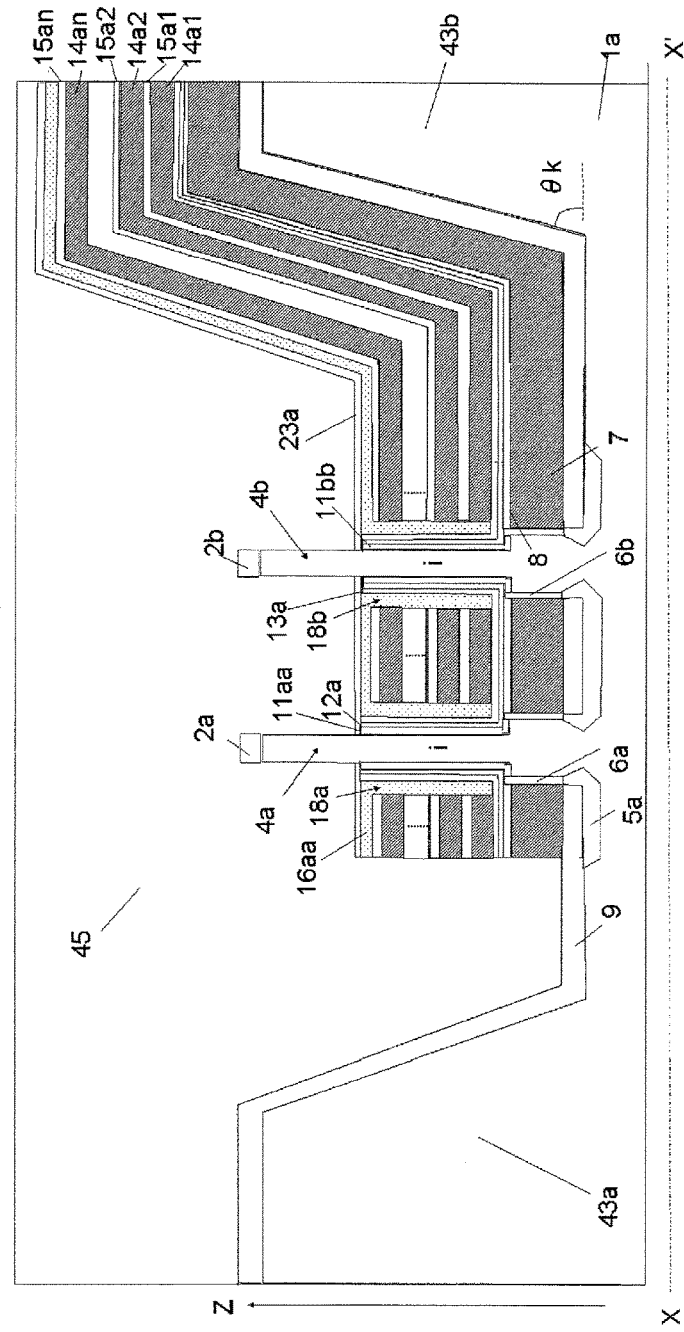
FIG. 7CA
FIG. 7CB

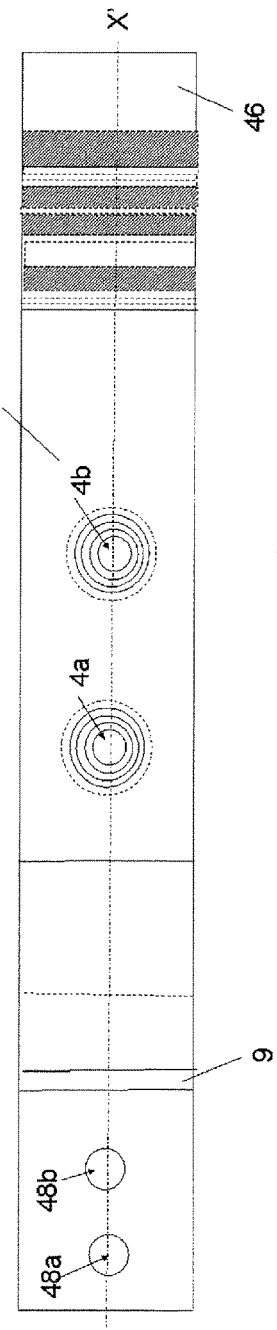
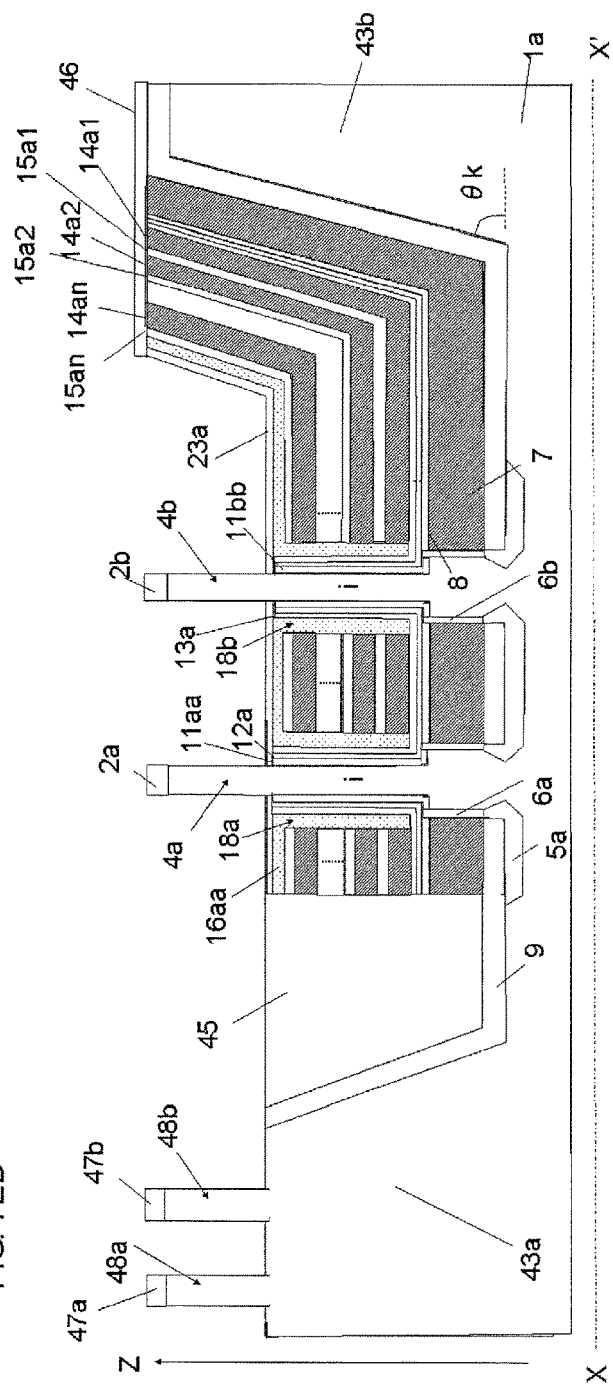

US 9,536,892 B2

PILLAR-SHAPED SEMICONDUCTOR MEMORY DEVICE AND METHOD FOR PRODUCING THE SAME

RELATED APPLICATIONS

The present application is a continuation of International Application PCT/JP2014/060983, with an international filing date of Apr. 17, 2014, the entire contents of which are incorporated herein by reference.

BACKGROUND OF THE INVENTION

1. Field of the Invention

The present invention relates to a pillar-shaped semiconductor memory device which is a memory device formed in a pillar-shaped semiconductor, and a method for producing the device.

2. Description of the Related Art

In recent years, electronic devices using a memory device typified by a flash memory have been used in various fields, and the market size and application fields of the devices have been further expanding. With these circumstances, the realization of highly integrated memory devices and a reduction in the cost of the memory devices have been desired.

NAND-type flash memory (refer to, for example, C. Y. Ting, V. J. Vivalda, and H. G. Schaefer: "Study of planarized sputter-deposited $SiO_2$", J. Vac. Sci. Technol. 15(3), p.p. 1105-1112, May/June (1978)) is advantageous in the realization of highly integrated devices and a reduction in the cost of the devices. Vertical NAND-type flash memory in which a plurality of memory cell-transistors are stacked around a semiconductor silicon pillar (hereinafter, a semiconductor silicon pillar is referred to as "Si pillar") may realize more highly integrated devices (refer to, for example, Japanese Unexamined Patent Application Publication No. 4-79369).

FIG. 9 illustrates a sectional structure of an example of a vertical NAND-type flash memory device in the related art (refer to, Japanese Unexamined Patent Application Publication No. 4-79369). Silicon (Si) pillars 101a and 101b are formed on an intrinsic semiconductor silicon substrate 100 (hereinafter, an intrinsic semiconductor silicon substrate is referred to as "i-layer substrate"). Silicon dioxide ($SiO_2$) layers 102a and 102b which are tunnel insulating layers are formed so as to surround outer peripheral portions of the Si pillars 101a and 101b, respectively. Floating electrodes 103a and 103b that electrically float are formed so as to surround outer peripheral portions of the $SiO_2$ layers 102a and 102b, respectively. Source-side selection gate electrodes 104a and 104b are formed around lower portions of the Si pillars 101a and 101b, respectively. Drain-side selection gate electrodes 105a and 105b are formed around upper portions of the Si pillars 101a and 101b, respectively. Interlayer $SiO_2$ layers 107a and 107b are formed so as to surround outer peripheries of the floating electrodes 103a and 103b, respectively. Word-line electrodes 108a and 108b are formed so as to surround outer peripheries of the interlayer $SiO_2$ layers 107a and 107b, respectively. A common source N' layer 109 (hereinafter, a semiconductor layer containing a donor impurity in a large amount is referred to as "$N^+$ layer") is formed in a surface layer of the i-layer substrate 100, the surface layer extending to bottom portions of the Si pillars 101a and 101b. Drain $N^+$ layers 110a and 110b are formed in top portions of the Si pillars 101a and 101b, respectively. A $SiO_2$ layer 111 is further formed by chemical vapor deposition (CVD) so as to cover the whole surface. Bit-line wiring metal layers 113a and 113b are respectively formed through contact holes 112a and 112b formed on the drain $N^+$ layers 110a and 110b, respectively. Furthermore, $P^-$ layers 114a and 114b (hereinafter, a semiconductor layer containing an acceptor impurity in a small amount is referred to as "$P^-$ layer") are respectively formed in the Si pillars 101a and 101b on the i-layer substrate 100. Memory cell-transistors Qc1 includes the $SiO_2$ layers 102a and 102b, the floating electrodes 103a and 103b, the interlayer $SiO_2$ layers 107a and 107b, and the word-line electrodes 108a and 108b, all of which are formed so as to surround outer peripheral portions of the $P^-$ layers 114a and 114b formed in the Si pillars 101a and 101b, respectively. Memory cell-transistors Qc2 and Qc3 that have the same structures as the memory cell-transistors Qc1 and that are electrically isolated from each other are formed on the memory cell-transistors Qc1. Furthermore, source-side selection transistors Qs1 having the source-side selection gate electrodes 104a and 104b are formed below the memory cell-transistors Qc1, Qc2, and Qc3. Drain-side selection transistors Qs2 having the drain-side selection gate electrodes 105a and 105b are formed above the memory cell-transistors Qc1, Qc2, and Qc3. With this structure, a vertical NAND-type flash memory device having a high density is provided.

In the vertical NAND-type flash memory element illustrated in FIG. 9, it is desirable to easily form the $SiO_2$ layers 102a and 102b which are tunnel insulating layers, the interlayer $SiO_2$ layers 107a and 107b, the source-side selection gate electrodes 104a and 104b, the drain-side selection gate electrodes 105a and 105b, the floating electrodes 103a and 103b, and the word-line electrodes 108a and 108b, all of which have less defects and high reliability, so as to surround outer peripheral portions of the Si pillars 101a and 101b, respectively.

A known vertical NAND-type flash memory is produced by repeatedly stacking word-line electrode material layers and insulation films in a vertical direction, subsequently forming a through-hole passing through the stacked word-line electrode material layers and the insulation films, subsequently forming an interlayer insulation film, a $Si_3N_4$ layer (silicon nitride layer) that stores data charges, and a tunnel $SiO_2$ layer on a surface layer of a side surface of the through-hole, and further filling the through-hole with a poly-Si layer (hereinafter, a polycrystalline Si layer is referred to as "poly-Si layer") functioning as a channel (refer to, for example, the specification of U.S. Patent Application Publication No. 2007/0252201). Also in this vertical NAND-type flash memory, it is desirable to easily form the interlayer insulation film, the $Si_3N_4$ layer, the tunnel $SiO_2$ layer, and the word-line electrodes, all of which have less defects and high reliability.

In the vertical NAND-type flash memory illustrated in FIG. 9, it is desirable to easily form, at a high density, the $SiO_2$ layers 102a and 102b, the interlayer $SiO_2$ layers 107a and 107b, the source-side selection gate electrodes 104a and 104b, the drain-side selection gate electrodes 105a and 105b, the floating electrodes 103a and 103b, and the word-line electrodes 108a and 108b, all of which have less defects and high reliability, so as to surround outer peripheral portions of the Si pillars 101a and 101b.

SUMMARY OF THE INVENTION

A pillar-shaped semiconductor memory device according to a first aspect of the present invention includes a semiconductor substrate, a first semiconductor pillar disposed on the semiconductor substrate and extending in a direction perpendicular to a surface of the semiconductor substrate, a tunnel insulating layer surrounding an outer periphery of the first semiconductor pillar, a data charge storage insulating layer surrounding an outer periphery of the tunnel insulating layer, a first interlayer insulating layer surrounding an outer periphery of the data charge storage insulating layer, a second interlayer insulating layer surrounding an outer periphery of the first interlayer insulating layer, a first conductor layer surrounding an outer periphery of the second interlayer insulating layer, and a third interlayer insulating layer that is in contact with an upper surface or a lower surface of the first conductor layer and that surrounds an outer periphery of the second interlayer insulating layer. In the pillar-shaped semiconductor memory device, at least one stacked material layer including the first conductor layer and the third interlayer insulating layer as one set is formed in a direction perpendicular to an upper surface of the semiconductor substrate. The second interlayer insulating layer is continuously formed between the first semiconductor pillar and a side surface of the at least one stacked material layer, the side surface facing the first semiconductor pillar, in a direction perpendicular to the at least one stacked material layer and extends to an upper surface of an uppermost layer of the at least one stacked material layer. Data writing and erasing due to a data charge transfer between the first semiconductor pillar and the data charge storage insulating layer through the tunnel insulating layer or a data charge retention by the data charge storage insulating layer is performed by application of a voltage to the first conductor layer.

A thickness of the second interlayer insulating layer disposed on the at least one stacked material layer is preferably larger than ½ of a thickness of the second interlayer insulating layer in contact with the first interlayer insulating layer.

Upper ends of the tunnel insulating layer, the data charge storage insulating layer, and the first interlayer insulating layer in the direction perpendicular to the at least one stacked material layer preferably have a height substantially equal to a height of an upper surface of the second interlayer insulating layer extending to the upper surface of the at least one stacked material layer.

A portion of the second interlayer insulating layer, the portion extending to the upper surface of the at least one stacked material layer, is preferably in contact with an upper surface of the first conductor layer.

The pillar-shaped semiconductor memory device preferably further includes an oxide insulating layer between the first conductor layer and the second interlayer insulating layer.

The at least one stacked material layer preferably includes a plurality of stacked material layers. The pillar-shaped semiconductor memory device preferably includes a first gate insulating layer formed above the stacked material layers and surrounding an outer periphery of the first semiconductor pillar, a second conductor layer surrounding an outer periphery of the first gate insulating layer, and a first impurity region formed in a top portion of the first semiconductor pillar and containing a donor or acceptor impurity. Preferably, the first conductor layer of each of the stacked material layers is connected to a word-line wiring metal layer, the second conductor layer is connected to a source-side selection gate wiring metal layer or a drain-side selection gate wiring metal layer, the first impurity region is connected to a common source line metal layer or a bit-line wiring metal layer, and a NAND-type flash memory device is formed in the first semiconductor pillar.

The at least one stacked material layer preferably includes a plurality of stacked material layers. The pillar-shaped semiconductor memory device preferably includes a second gate insulating layer formed below the stacked material layers and surrounding an outer periphery of the first semiconductor pillar, a third conductor layer surrounding an outer periphery of the second gate insulating layer, and a second impurity region formed below the stacked material layers and in a bottom portion of the first semiconductor pillar and having the same conductivity type as the first impurity region. The NAND-type flash memory device is preferably formed in the first semiconductor pillar in which the third conductor layer is connected to the source-side selection gate wiring metal layer, the second impurity region is connected to the common source line metal layer, the second conductor layer is connected to the drain-side selection gate wiring metal layer, and the first impurity region is connected to the bit-line wiring metal layer.

Preferably, the side surface of the at least one stacked material layer is not in contact with but is separated from a side surface of the first interlayer insulating layer, the side surface facing the side surface of the at least one stacked material layer.

The pillar-shaped semiconductor memory device preferably further includes a first outer peripheral semiconductor region formed in an outer periphery of a memory element region in which the first semiconductor pillar is formed so that a height of an upper surface of the first outer peripheral semiconductor region is substantially equal to a height of a top portion of the first semiconductor pillar; a second semiconductor pillar which is formed in a second outer peripheral semiconductor region included in the first outer peripheral semiconductor region, whose top portion has a height substantially equal to that of the top portion of the first semiconductor pillar, and whose bottom surface has a height substantially equal to that of a bottom surface of the second conductor layer; a third gate insulating layer surrounding an outer peripheral portion of the second semiconductor pillar; a fourth conductor layer which is formed so as to surround an outer periphery of the third gate insulating layer, and whose upper and lower ends have heights substantially equal to those of upper and lower ends of the second conductor layer; a third impurity region formed above the fourth conductor layer and in a top portion of the second semiconductor pillar and containing a donor or acceptor impurity; and a fourth impurity region formed below the fourth conductor layer and in a bottom portion of the second semiconductor pillar and having the same conductivity type as the third impurity region. A surrounding gate MOS transistor (SGT) is preferably formed in which when one of the third impurity region and the fourth impurity region functions as a source, the other functions as a drain, the second semiconductor pillar disposed between the third impurity region and the fourth impurity region functions as a channel, and the fourth conductor layer functions as a gate.

The pillar-shaped semiconductor memory device preferably further includes a fourth interlayer insulating layer that is formed on the semiconductor substrate so as to surround the outer periphery of the first semiconductor pillar, and that extends to a side surface and an upper surface of the first outer peripheral semiconductor region; and a contact hole connected to an upper surface of the first conductor layer of one of the stacked material layers that have an upper surface on an upper end of a side surface of the first outer peripheral semiconductor region. The stacked material layers are preferably formed on the fourth interlayer insulating layer. The upper surface of the stacked material layers preferably has a height substantially equal to that of an upper surface of the fourth interlayer insulating layer located on the first outer peripheral semiconductor region. The first conductor layer and the word-line wiring metal layer are preferably connected to each other through the contact hole.

A method for producing a pillar-shaped semiconductor memory device according to a second aspect of the present invention includes a mask insulating layer-forming step of forming, on a semiconductor substrate, a mask insulating layer having a circular shape in plan view; a first semiconductor pillar-forming step of etching the semiconductor substrate using the mask insulating layer as a mask to form a semiconductor pillar on the semiconductor substrate, and retracting a side surface of the semiconductor pillar inward in a radial direction of the semiconductor pillar to form a first semiconductor pillar; a tunnel insulating layer-forming step of forming a tunnel insulating layer so as to surround an outer periphery of the first semiconductor pillar; a data charge storage insulating layer-forming step of forming a data charge storage insulating layer so as to surround an outer periphery of the tunnel insulating layer; a first interlayer insulating layer-forming step of forming a first interlayer insulating layer so as to surround an outer periphery of the data charge storage insulating layer; a first conductor layer-forming step of forming a first conductor layer on an outer periphery of the first semiconductor pillar and above the semiconductor substrate by allowing a material atom to be incident in a direction perpendicular to an upper surface of the mask insulating layer; a third interlayer insulating layer-forming step of forming a third interlayer insulating layer on the outer periphery of the first semiconductor pillar and above the semiconductor substrate by allowing a material atom to be incident on the first conductor layer in a direction perpendicular to the upper surface of the mask insulating layer; a stacked material layer-forming step of forming at least one stacked material layer in a direction perpendicular to an upper surface of the semiconductor substrate, the stacked material layer including the first conductor layer and the third interlayer insulating layer as one set; and a second interlayer insulating layer-forming step of forming a second interlayer insulating layer in a space formed between a side surface of the first interlayer insulating layer and side surfaces of the first conductor layer and the third interlayer insulating layer. In the method, data writing and erasing due to a data charge transfer between the first semiconductor pillar and the data charge storage insulating layer through the tunnel insulating layer or data charge retention by the data charge storage insulating layer is performed by application of a voltage to the first conductor layer.

The second interlayer insulating layer formed on the side surface of the first interlayer insulating layer is preferably formed so as to extend to an upper surface of an uppermost layer of the at least one stacked material layer.

The second interlayer insulating layer is preferably formed so that a thickness of the second interlayer insulating layer on the upper surface of the uppermost layer of the at least one stacked material layer is larger than ½ of a thickness of the second interlayer insulating layer in contact with the first interlayer insulating layer.

After the stacked material layer-forming step, heat treatment is preferably performed in an atmosphere containing hydrogen.

The method preferably further includes, after the stacked material layer-forming step, forming an oxide insulating layer in a surface layer of a side surface of the first conductor layer by performing heat treatment in an atmosphere containing oxygen.

The method preferably includes a truncated cone-shaped mask insulating layer-forming step of forming, instead of the mask insulating layer, a truncated cone-shaped mask insulating layer on the first semiconductor pillar; and a cone-shaped stacked material layer-forming step of depositing a material atom by allowing the material atom to be incident in a direction perpendicular to the upper surface of the semiconductor substrate under a condition in which a deposition rate of the material atom on a side surface of the truncated cone-shaped mask insulating layer is lower than a removal rate of the material atom to form the at least one stacked material layer above the semiconductor substrate and to form, on the truncated cone-shaped mask insulating layer, a cone-shaped stacked material layer formed of the same material as the at least one stacked material layer.

The method preferably further includes a first gate insulating layer-forming step of forming a first gate insulating layer above the at least one stacked material layer so as to surround the outer periphery of the first semiconductor pillar, a second conductor layer-forming step of forming a second conductor layer so as to surround an outer periphery of the first gate insulating layer, a first impurity region-forming step of forming a first impurity region in a top portion of the first semiconductor pillar, the first impurity region containing a donor or acceptor impurity, a second gate insulating layer-forming step of forming a second gate insulating layer below the at least one stacked material layer so as to surround the outer periphery of the first semiconductor pillar, a third conductor layer-forming step of forming a third conductor layer so as to surround an outer periphery of the second gate insulating layer, a step of connecting the first conductor layer of the at least one stacked material layer to a word-line wiring metal layer, a step of connecting the second conductor layer to a source-side selection gate wiring metal layer or a drain-side selection gate wiring metal layer, and a step of connecting the first impurity region to a common source line metal layer or a bit-line wiring metal layer.

The method preferably includes a second gate insulating layer-forming step of forming a second gate insulating layer below the at least one stacked material layer so as to surround the outer periphery of the first semiconductor pillar, a third conductor layer-forming step of forming a third conductor layer so as to surround an outer periphery of the second gate insulating layer, and a second impurity region-forming step of forming a second impurity region below the third conductor layer and in a bottom portion of the first semiconductor pillar, the second impurity region having the same conductivity type as the first impurity region. In the method, preferably, the first conductor layer of the at least one stacked material layer is connected to the word-line wiring metal layer, the third conductor layer is connected to the source-side selection gate wiring metal layer, the second impurity region is connected to the common source line metal layer, the second conductor layer is connected to the drain-side selection gate wiring metal layer, and the first impurity region is connected to the bit-line wiring metal layer to form a NAND-type flash memory device in the first semiconductor pillar.

The method preferably further includes a first outer peripheral semiconductor region-forming step of forming, in an outer periphery of a memory element region in which the first semiconductor pillar is formed, a first outer peripheral semiconductor region whose upper surface has a height substantially equal to a height of a top portion of the first semiconductor pillar; a second semiconductor pillar-forming step of forming, in a second outer peripheral semiconductor region included in the first outer peripheral semiconductor region, a second semiconductor pillar whose top portion has a height substantially equal to that of the top portion of the first semiconductor pillar, and whose bottom surface has a height substantially equal to that of a bottom surface of the second conductor layer; a third gate insulating layer-forming step of forming a third gate insulating layer so as to surround an outer periphery of the second semiconductor pillar; a fourth conductor layer-forming step of forming a fourth conductor layer whose upper and lower ends have heights substantially equal to those of upper and lower ends of the second conductor layer in a direction perpendicular to the semiconductor substrate so as to surround an outer periphery of the third gate insulating layer; a third impurity region-forming step of forming a third impurity region above the fourth conductor layer and in a top portion of the second semiconductor pillar, the third impurity region containing a donor or acceptor impurity; and a fourth impurity region-forming step of forming a fourth impurity region below the fourth conductor layer and in a bottom portion of the second semiconductor pillar, the fourth impurity region having the same conductivity type as the third impurity region. In the method, a surrounding gate MOS transistor (SGT) is preferably formed in which when one of the third impurity region and the fourth impurity region functions as a source, the other functions as a drain, the second semiconductor pillar disposed between the third impurity region and the fourth impurity region functions as a channel, and the fourth conductor layer function as a gate.

The method preferably further includes a fourth interlayer insulating layer-forming step of forming a fourth interlayer insulating layer on the first outer peripheral semiconductor region, on a side surface of the first outer peripheral semiconductor region, and on the semiconductor substrate in the outer periphery of the first semiconductor pillar disposed in the memory element region; and a contact hole-forming step of forming a contact hole connected to an upper surface of the first conductor layer. In the method, the at least one stacked material layer is preferably formed on the fourth interlayer insulating layer so as to surround the outer periphery of the first semiconductor pillar and to extend to the side surface of the first outer peripheral semiconductor region. The at least one stacked material layer is preferably formed such that the upper surface of the at least one stacked material layer has a height substantially equal to that of an upper surface of the fourth interlayer insulating layer located on the first outer peripheral semiconductor region. The first conductor layer and the word-line wiring metal layer are preferably connected to each other through the contact hole.

According to the aspects of the present invention, a pillar-shaped semiconductor memory device having high reliability and a high density can be provided at a low cost.

BRIEF DESCRIPTION OF THE DRAWINGS

FIG. 2AA and FIGS. 2AB and 2AC are respectively a plan view and sectional structural views illustrating a vertical NAND-type flash memory device according to the first embodiment and a method for producing the device.

FIG. 2DA and FIGS. 2DB and 2DC are respectively a plan view and sectional structural views illustrating a vertical NAND-type flash memory device according to the first embodiment and a method for producing the device.

FIG. 2FA and FIGS. 2FB and 2FC are respectively a plan view and sectional structural views illustrating a vertical NAND-type flash memory device according to the first embodiment and a method for producing the device.

FIG. 2HA and FIGS. 2HB and 2HC are respectively a plan view and sectional structural views illustrating a vertical NAND-type flash memory device according to the first embodiment and a method for producing the device.

FIG. 3A and FIGS. 3B and 3C are respectively a plan view and sectional structural views illustrating a vertical NAND-type flash memory device according to a second embodiment of the present invention and a method for producing the device.

FIG. 4BA and FIGS. 4BB and 4BC are respectively a plan view and sectional structural views illustrating a vertical NAND-type flash memory device according to the third embodiment and a method for producing the device.

FIG. 5BA and FIGS. 5BB and 5BC are respectively a plan view and sectional structural views illustrating a vertical NAND-type flash memory device according to the fourth embodiment and a method for producing the device.

FIG. 5CA and FIGS. 5CB and 5CC are respectively a plan view and sectional structural views illustrating a vertical NAND-type flash memory device according to the fourth embodiment and a method for producing the device.

FIGS. 7BA and 7BB are respectively a plan view and a sectional structural view illustrating a vertical NAND-type flash memory device according to the sixth embodiment and a method for producing the device.

FIGS. 7CA and 7CB are respectively a plan view and a sectional structural view illustrating a vertical NAND-type flash memory device according to the sixth embodiment and a method for producing the device.

FIGS. 7EA and 7EB are respectively a plan view and a sectional structural view illustrating a vertical NAND-type flash memory device according to the sixth embodiment and a method for producing the device.

DETAILED DESCRIPTION OF THE PREFERRED EMBODIMENTS

Vertical NAND-type flash memory devices which are pillar-shaped semiconductor memory devices according to embodiments of the present invention and methods for producing the devices will now be described with reference to the drawings.

First Embodiment

A method for producing a vertical NAND-type flash memory device according to a first embodiment of the present invention will now be described with reference to FIG. 1 and FIGS. 2AA to 2LC.

Figure 1:
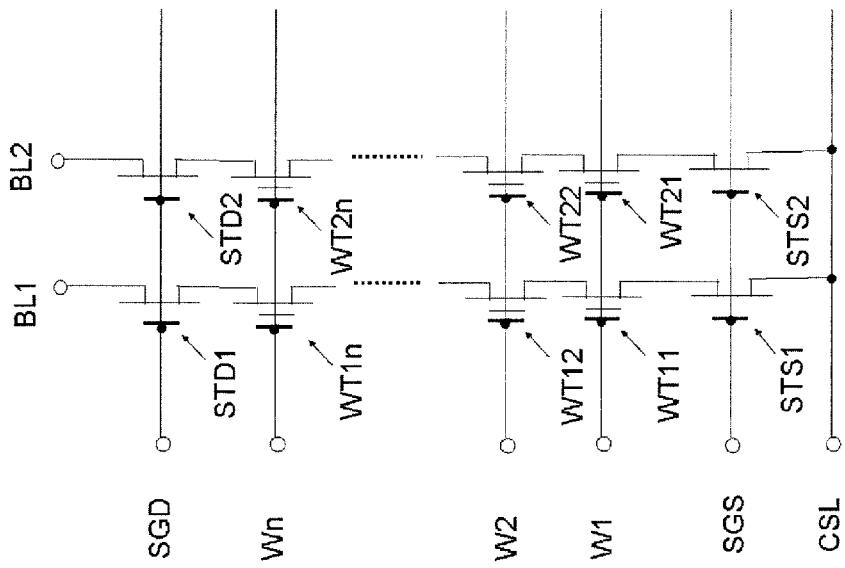
FIG. 1 is a circuit diagram of a vertical NAND-type flash memory device according to a first embodiment of the present invention.

FIG. 1 illustrates a NAND-type flash memory circuit according to a first embodiment. Gate electrodes of memory cell-transistors WT11, WT12, and WT1$n$, the number of which is n, and which are connected in series are respectively connected to word lines W1, W2, and Wn, the number of which is n. A source-side selection transistor STS1 and a drain-side selection transistor STD1 are respectively connected to the lower side and the upper side of the memory cell-transistors WT11, WT12, and WT1$n$, the number of which is n. A gate electrode of the source-side selection transistor STS1 is connected to a source-side selection gate wiring metal layer SGS. A gate electrode of the drain-side selection transistor STD1 is connected to a drain-side selection gate wiring metal layer SGD. A source of the source-side selection transistor STS1 is connected to a common source line metal layer CSL. A drain of the drain-side selection transistor STD1 is connected to a bit line BL1. Memory cell-transistors WT21, WT22, and WT2$n$, the number of which is n, and which are connected in series are formed in parallel with the memory cell-transistors WT11, WT12, and WT1$n$, the number of which is n, and which are connected in series. Gate electrodes of the memory cell-transistors WT21, WT22, and WT2$n$, the number of which is n, are respectively connected to the word lines W1, W2, and Wn. A source-side selection transistor STS2 and a drain-side selection transistor STD2 are respectively connected to the lower side and the upper side of the memory cell-transistors WT21, WT22, and WT2$n$. A gate electrode of the source-side selection transistor STS2 is connected to the source-side selection gate wiring metal layer SGS. A gate electrode of the drain-side selection transistor STD2 is connected to the drain-side selection gate wiring metal layer SGD. A source of the source-side selection transistor STS2 is connected to the common source line metal layer CSL. A drain of the drain-side selection transistor STD2 is connected to a bit line BL2. The configuration including this circuit is repeatedly formed in a block memory element region.

A method for producing a pillar-shaped semiconductor memory device according to the first embodiment will now be described with reference to FIGS. 2AA to 2LC. In FIGS. 2AA to 2LC, the drawings whose last reference character is A are plan views, the drawings whose last reference character is B are sectional views taken along line X-X' in the drawings whose last reference character is A, and the drawings whose last reference character is C are sectional views taken along line Y-Y' in the drawings whose last reference character is A.

As illustrated in FIGS. 2AA to 2AC, a $Si_3N_4$ film (not illustrated) is formed on an i-layer substrate 1, a resist film (not illustrated) is applied onto the $Si_3N_4$ film, and resist layers 3$a$, 3$b$, 3$c$, and 3$d$ each having a circular shape in plan view are formed by lithography. Next, the $Si_3N_4$ film is etched by, for example, reactive ion etching (RIE) using the resist layers 3$a$, 3$b$, 3$c$, and 3$d$ as a mask to form $Si_3N_4$ layers 2$a$, 2$b$, 2$c$, and 2$d$, respectively.

Figure 2B:
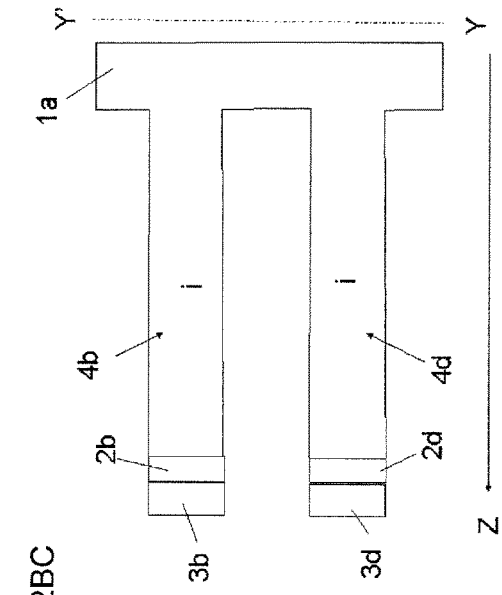
FIG. 2BA and FIGS. 2BB and 2BC are respectively a plan view and sectional structural views illustrating a vertical NAND-type flash memory device according to the first embodiment and a method for producing the device.
Figure 2B:
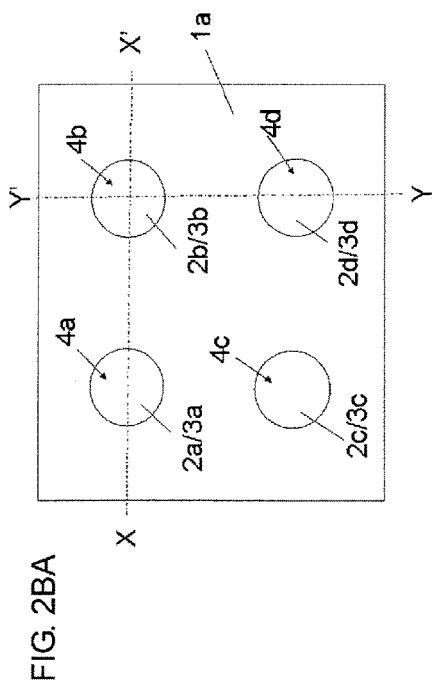
Figure 2B:
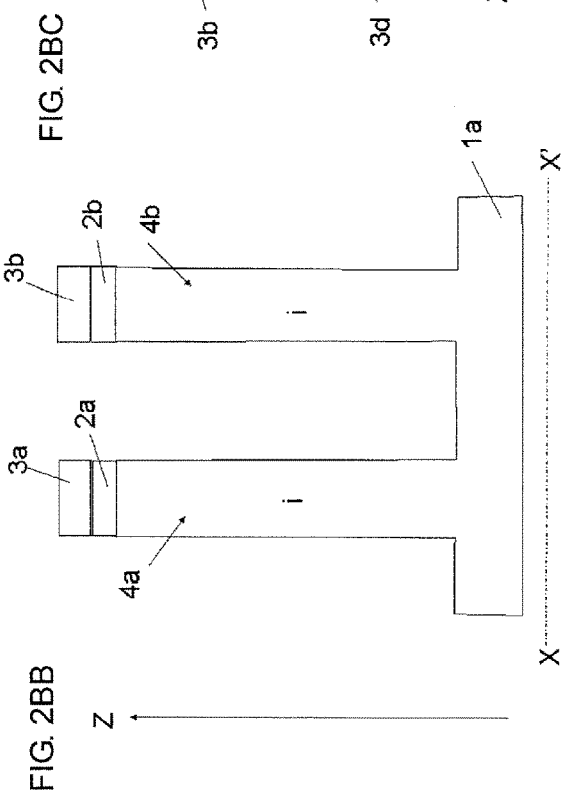

Next, as illustrated in FIGS. 2BA to 2BC, the i-layer substrate 1 is etched by, for example, RIE using the resist layers 3$a$, 3$b$, 3$c$, and 3$d$ and the $Si_3N_4$ layers 2$a$, 2$b$, 2$c$, and 2$d$ as a mask to respectively form Si pillars 4$a$, 4$b$, 4$c$, and 4$d$ on an i-layer substrate 1$a$. The resist layers 3$a$, 3$b$, 3$c$, and 3$d$ are then removed.

Figure 2C:
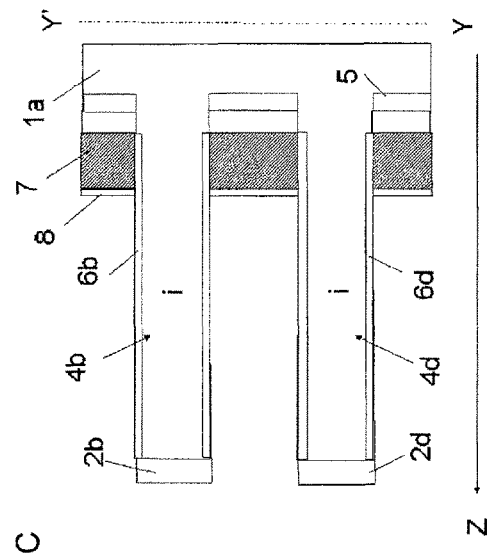
FIG. 2CA and FIGS. 2CB and 2CC are respectively a plan view and sectional structural views illustrating a vertical NAND-type flash memory device according to the first embodiment and a method for producing the device.
Figure 2C:
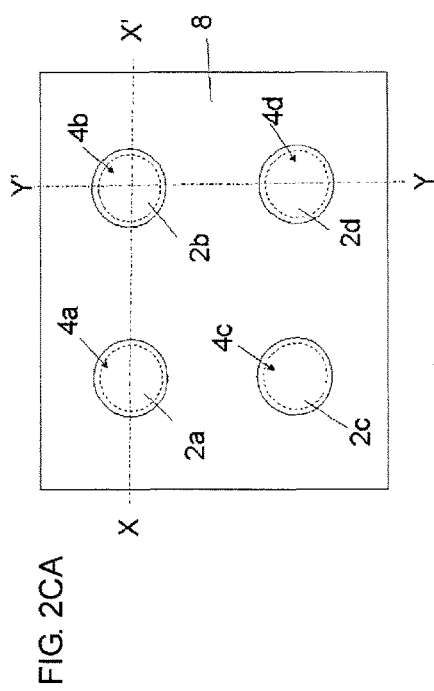
Figure 2C:
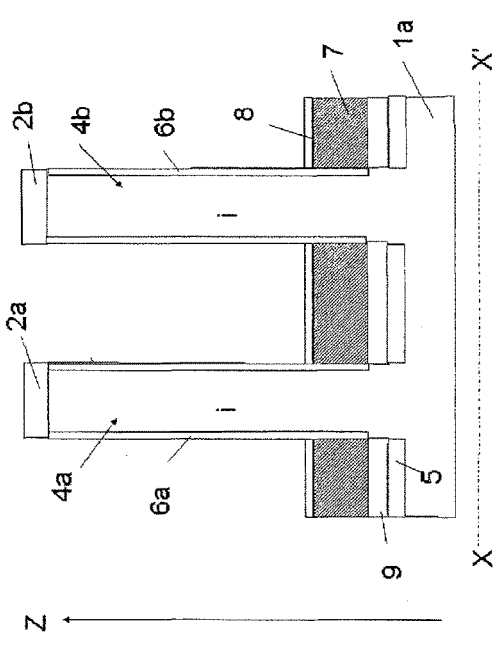

Next, as illustrated in FIGS. 2CA to 2CC, for example, an arsenic (As) ion is implanted into a surface layer of the i-layer substrate 1$a$ disposed on outer peripheries of the Si pillars 4$a$, 4$b$, 4$c$, and 4$d$ to form an N$^+$ layer 5. A $SiO_2$ layer 9 is formed on the i-layer substrate 1$a$ disposed on the outer peripheries of the Si pillars 4$a$, 4$b$, 4$c$, and 4$d$. Furthermore, $SiO_2$ layers 6$a$, 6$b$, 6$c$, and 6$d$ (the $SiO_2$ layer 6$c$ is not illustrated in the figures) are respectively formed by, for example, a thermal oxidation method in surface layers of side surfaces of the Si pillars 4$a$, 4$b$, 4$c$, and 4$d$. Subsequently, a doped Si layer 7 (hereinafter, a poly-Si layer containing an acceptor or donor impurity is referred to as "doped Si layer") is formed on the SiO$_2$ layer 9 disposed on the outer peripheries of the Si pillars 4a, 4b, 4c, and 4d. Subsequently, a Si$_3$N$_4$ layer 8 is formed on the doped Si layer 7.

Next, as illustrated in FIGS. 2DA to 2DC, SiO$_2$ layers 10a, 10b, 10c, and 10d (the SiO$_2$ layer 10c is not illustrated in the figures) are formed by a thermal oxidation method so as to have a large thickness in surface layers of the side surfaces of the Si pillars 4a, 4b, 4c, and 4d using the Si$_3$N$_4$ layers 2a, 2b, 2c, and 2d and the Si$_3$N$_4$ layer 8 as a mask. Subsequently, the SiO$_2$ layers 10a, 10b, 10c, and 10d are removed. The Si$_3$N$_4$ layer 8 is not oxidized by the thermal oxidation method. Therefore, as a result of the removal of the SiO$_2$ layers 10a, 10b, 10c, and 10d, the side surfaces of the Si pillars 4a, 4b, 4c, and 4d are retracted inward in the radial direction. Consequently, the diameters of cross sections of the Si pillars 4a, 4b, 4c, and 4d become smaller than the diameters of cross sections of the Si$_3$N$_4$ layers 2a, 2b, 2c, and 2d, respectively.

Figure 2E:
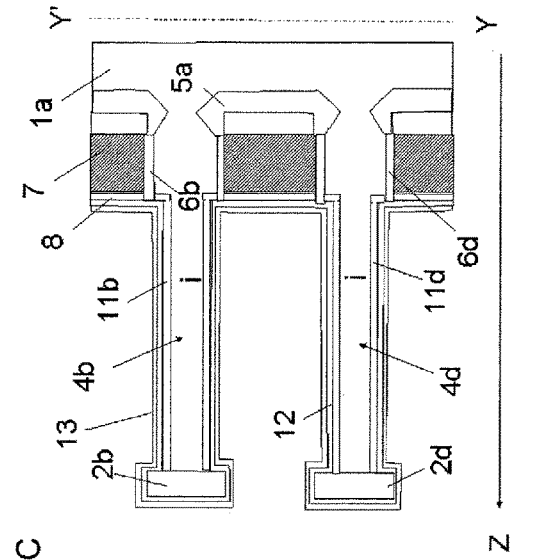
FIG. 2EA and FIGS. 2EB and 2EC are respectively a plan view and sectional structural views illustrating a vertical NAND-type flash memory device according to the first embodiment and a method for producing the device.
Figure 2E:
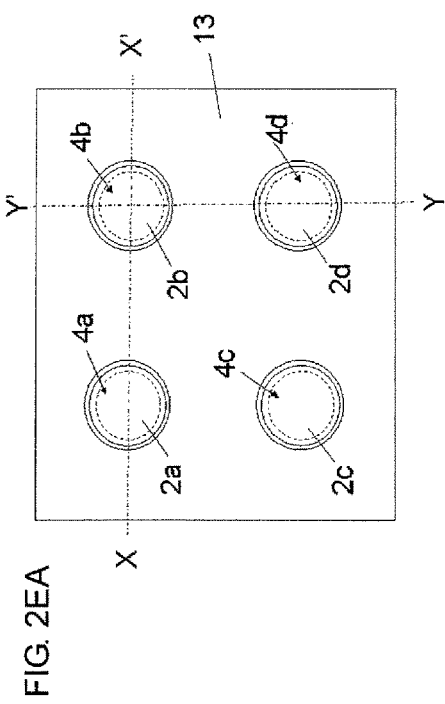
Figure 2E:
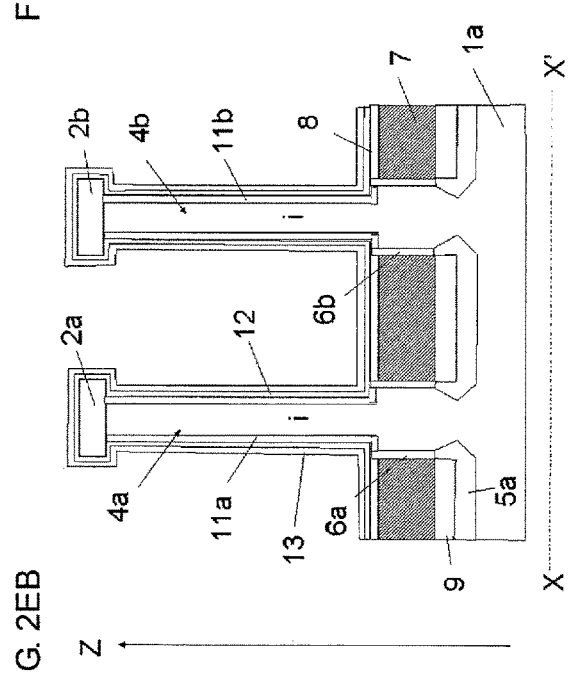

Next, as illustrated in FIGS. 2EA to 2EC, SiO$_2$ layers 11a, 11b, 11c, and 11d (the SiO$_2$ layer 11c is not illustrated in the figures) which are to become tunnel insulating layers are respectively formed by, for example, a thermal oxidation method in surface layers of the side surfaces of the Si pillars 4a, 4b, 4c, and 4d. Subsequently, a Si$_3$N$_4$ layer 12 which is to become a data charge storage insulating layer and a SiO$_2$ layer 13 which is to become an interlayer insulating layer are formed by, for example, atomic layer deposition (ALD) so as to cover the whole surface.

Next, as illustrated in FIGS. 2FA to 2FC, a Si material containing a donor or acceptor impurity and a SiO$_2$ material are allowed to be incident in a direction perpendicular to a surface of the i-layer substrate 1a by, for example, a bias sputtering method to form doped Si layers 14a1, 14a2, and 14an and SiO$_2$ layers 15a1, 15a2, and 15an on outer peripheries of the Si pillars 4a, 4b, 4c, and 4d. A plurality of stacked material layers 14a1, 15a1, 14a2, 15a2, 14an, and 15an including, as one set, the doped Si layers 14a1, 14a2, or 14an and the corresponding SiO$_2$ layer 15a1, 15a2, or 15an are formed in a direction perpendicular to an upper surface of the i-layer substrate 1a. In this embodiment, a plurality of stacked material layers are formed. Alternatively, a single stacked material layer may be formed. In this step, doped Si layers 14b1, 14b2, 14bn, 14c1, 14c2, 14cn, 14d1, 14d2, 14dn, 14e1, 14e2, and 14en (the doped Si layers 14d1, 14d2, and 14dn are not illustrated in the figures) and SiO$_2$ layers 15b1, 15b2, 15bn, 15c1, 15c2, 15cn, 15d1, 15d2, 15dn, 15e1, 15e2, and 15en (the SiO$_2$ layers 15d1, 15d2, and 15dn are not illustrated in the figure) are stacked on the Si pillars 4a, 4b, 4c, and 4d. As described above, the Si material containing a donor or acceptor impurity and the SiO$_2$ material are incident in a direction perpendicular to a surface of the i-layer substrate 1a. Therefore, the Si$_3$N$_4$ layers 2a, 2b, 2c, and 2d function as a mask, and spaces 18a, 18b, 18c, and 18d (the space 18c is not illustrated in the figures) are formed between the side surface of the SiO$_2$ layer 13 formed on the side surfaces of the Si pillars 4a, 4b, 4c, and 4d and the side surfaces of the doped Si layers 14a1, 14a2, and 14an and the SiO$_2$ layers 15a1, 15a2, and 15an. Accordingly, the side surfaces of the doped Si layers 14a1, 14a2, and 14an and the SiO$_2$ layers 15a1, 15a2, and 15an do not come in contact with the side surface of the SiO$_2$ layer 13 formed on the side surfaces of the Si pillars 4a, 4b, 4c, and 4d.

Figure 2G:
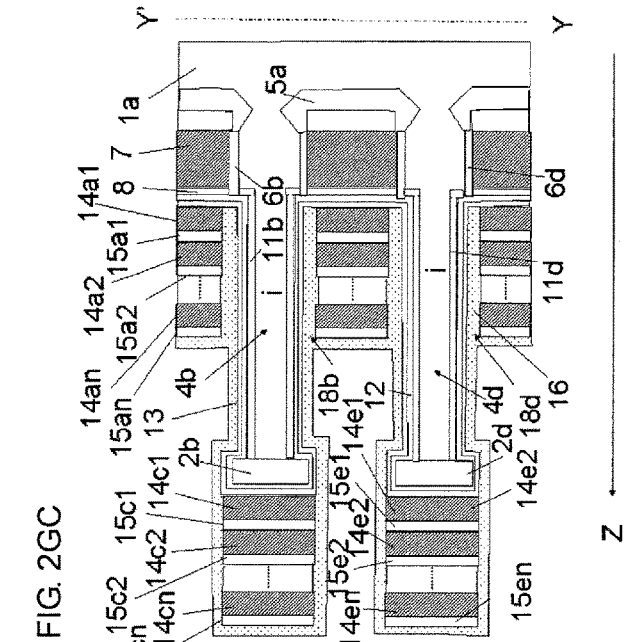
FIG. 2GA and FIGS. 2GB and 2GC are respectively a plan view and sectional structural views illustrating a vertical NAND-type flash memory device according to the first embodiment and a method for producing the device.
Figure 2G:
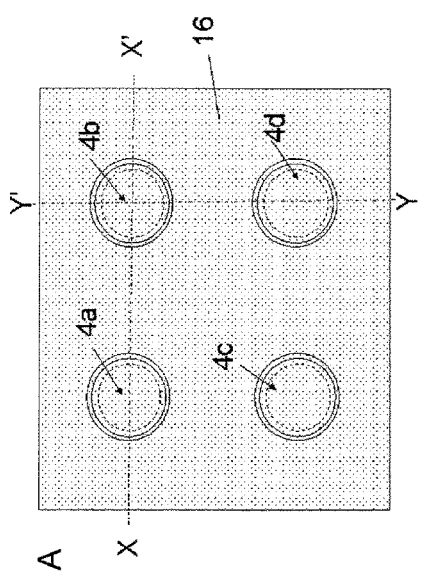
Figure 2G:
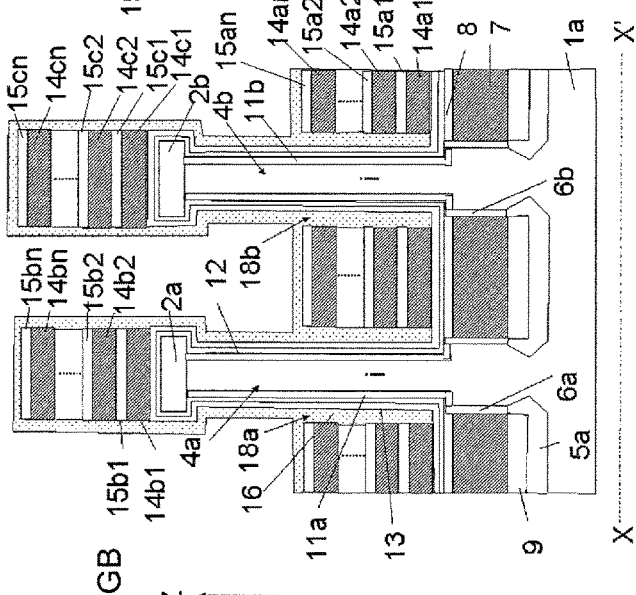

Next, as illustrated in FIGS. 2GA to 2GC, a hafnium oxide layer 16 (hereinafter, a hafnium oxide layer is referred to as "HfO$_2$ layer") is formed by, for example, ALD so as to cover the SiO$_2$ layers 15a and the Si pillars 4a, 4b, 4c, and 4d. As a result, the spaces 18a, 18b, 18c, and 18d are filled with the HfO$_2$ layer 16. To fill the spaces 18a, 18b, 18c, and 18d with the HfO$_2$ layer 16, a thickness of the HfO$_2$ layer 16 deposited on the SiO$_2$ layer 15an is preferably larger than ½ of a width of each of the spaces 18a, 18b, 18c, and 18d.

Next, as illustrated in FIGS. 2HA to 2HC, a resist layer 17 is formed on the outer peripheries of the Si pillars 4a, 4b, 4c, and 4d. Subsequently, the HfO$_2$ layer 16 that covers the Si pillars 4a, 4b, 4c, and 4d and the SiO$_2$ layers 15b1, 15b2, 15bn, 15c1, 15c2, 15cn, 15d1, 15d2, 15dn, 15e1, 15e2, and 15en is removed by plasma etching using the resist layer 17 as a mask. As a result, a HfO$_2$ layer 16a remains in the spaces 18a, 18b, 18c, and 18d and on the SiO$_2$ layer 15an disposed on the outer peripheries of the Si pillars 4a, 4b, 4c, and 4d. The HfO$_2$ layer 16a extends from the inside of the spaces 18a, 18b, 18c, and 18d to an upper surface of the SiO$_2$ layer 15an disposed on the outer peripheries of the Si pillars 4a, 4b, 4c, and 4d.

Figure 2I:
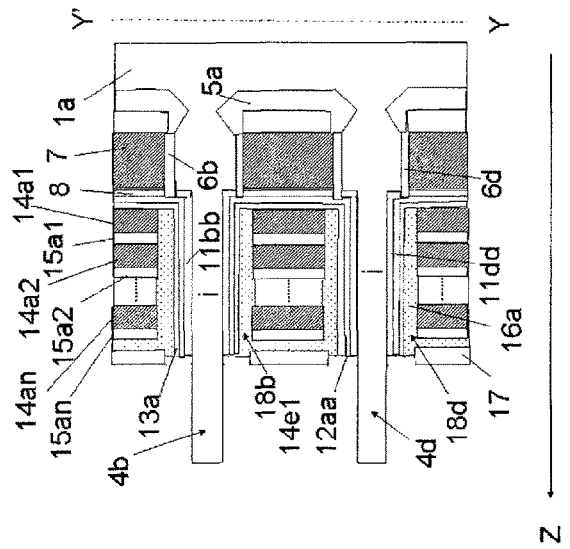
FIG. 2IA and FIGS. 2IB and 2IC are respectively a plan view and sectional structural views illustrating a vertical NAND-type flash memory device according to the first embodiment and a method for producing the device.
Figure 2I:
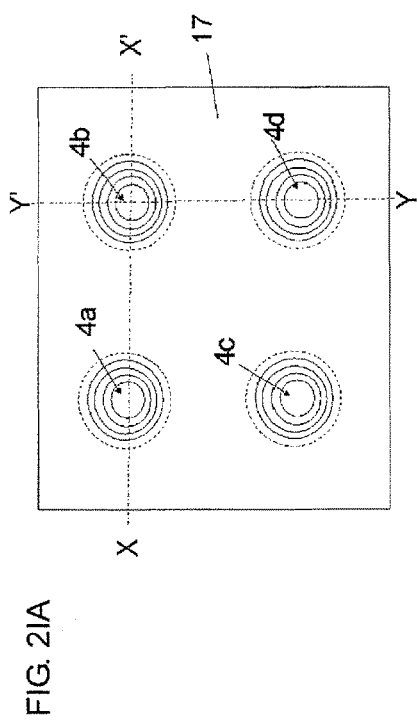
Figure 2I:
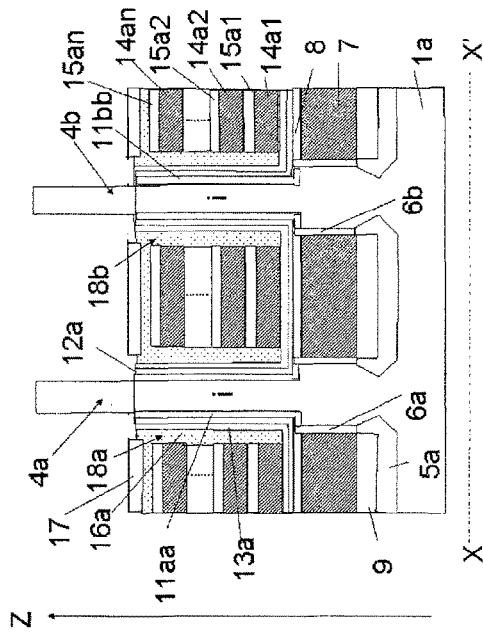

Next, as illustrated in FIGS. 2IA to 2IC, the doped Si layers 14b1, 14b2, 14bn, 14c1, 14c2, 14cn, 14d1, 14d2, 14dn, 14e1, 14e2, and 14en and the SiO$_2$ layers 15b1, 15b2, 15bn, 15c1, 15c2, 15cn, 15d1, 15d2, 15dn, 15e1, 15e2, and 15en on the Si pillars 4a, 4b, 4c, and 4d are removed. Subsequently, the SiO$_2$ layers 11a, 11b, 11c, and 11d, the Si$_3$N$_4$ layer 12, and the SiO$_2$ layer 13 that are located above the upper surface of the resist layer 17 and that cover the Si pillars 4a, 4b, 4c, and 4d are removed. The Si$_3$N$_4$ layers 2a, 2b, 2c, and 2d are then removed. Subsequently, the resist layer 17 is removed. As a result, the upper ends of SiO$_2$ layers 11aa, 11bb, 11cc, and 11dd, a Si$_3$N$_4$ layer 12a, and a SiO$_2$ layer 13a that surround the outer peripheries of the Si pillars 4a, 4b, 4c, and 4d in a direction perpendicular to the stacked material layers 14a1, 15a1, 14a2, 15a2, 14an, and 15an have a height substantially equal to that of the upper surface of the HfO$_2$ layer 16a extending to the upper surface of the SiO$_2$ layer 15an located on the outer peripheries of the Si pillars 4a, 4b, 4c, and 4d.

Figure 2J:
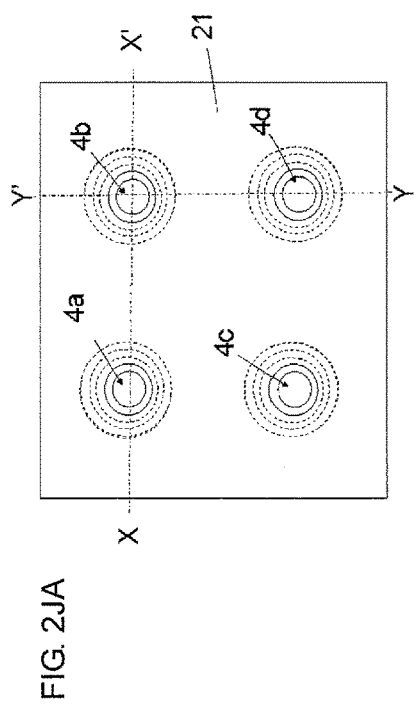
FIG. 2JA and FIGS. 2JB and 2JC are respectively a plan view and sectional structural views illustrating a vertical NAND-type flash memory device according to the first embodiment and a method for producing the device.
Figure 2J:
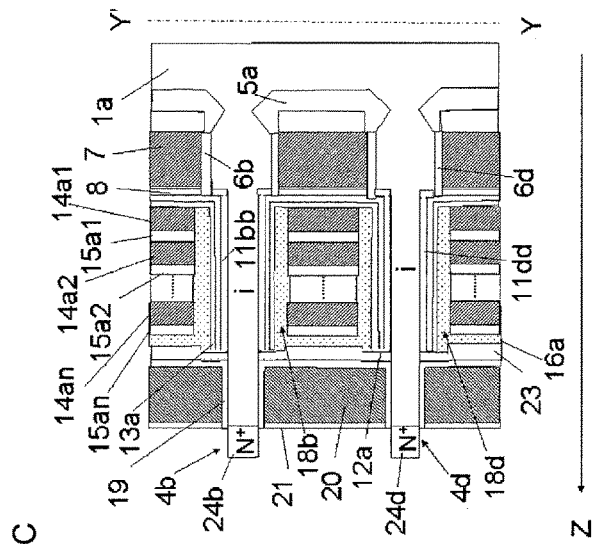
Figure 2J:
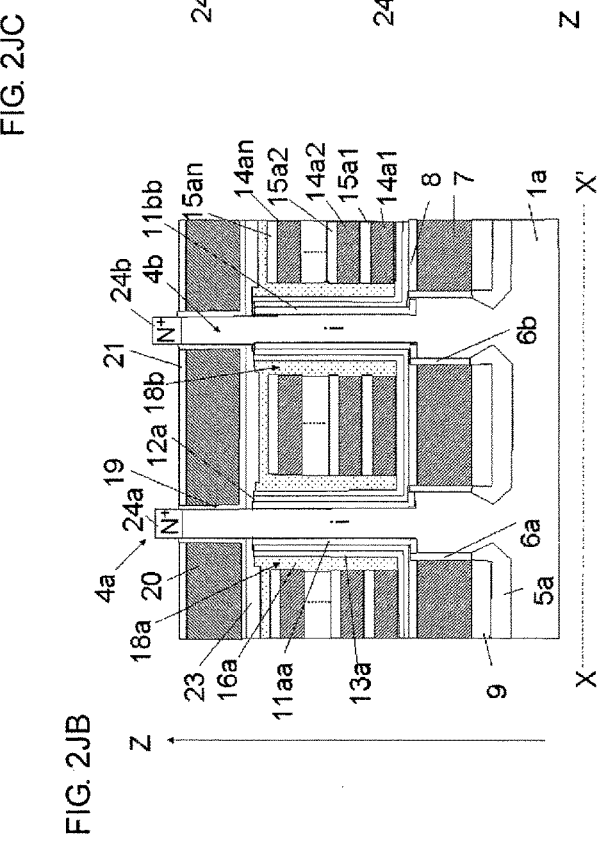

Next, as illustrated in FIGS. 2JA to 2JC, a SiO$_2$ layer 23 is formed so as to cover the upper surface of the HfO$_2$ layer 16a disposed on the outer peripheries of the Si pillars 4a, 4b, 4c, and 4d and upper surface ends of the SiO$_2$ layers 11aa, 11bb, 11cc, and 11dd, the Si$_3$N$_4$ layer 12a, and the SiO$_2$ layer 13a. Subsequently, a HfO$_2$ layer 19 is formed so as to cover the upper surface of the SiO$_2$ layer 23 and top portions of the Si pillars 4a, 4b, 4c, and 4d. Subsequently, a doped Si layer 20 and a SiO$_2$ layer 21 are formed by, for example, a bias sputtering method. The doped Si layer and the SiO$_2$ layer that are formed on the Si pillars 4a, 4b, 4c, and 4d in this step are then removed (not illustrated). The HfO$_2$ layer 19 disposed on top portions of the Si pillars 4a, 4b, 4c, and 4d is then removed. Subsequently, N$^+$ layers 24a, 24b, 24c, and 24d (the N$^+$ layer 24c is not illustrated in the figures) are formed in the top portions of the Si pillars 4a, 4b, 4c, and 4d by, for example, arsenic (As) ion implantation.

Figure 2K:
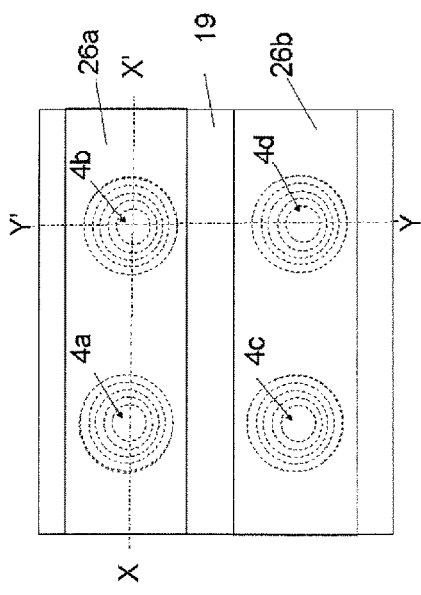
FIG. 2KA and FIGS. 2KB and 2KC are respectively a plan view and sectional structural views illustrating a vertical NAND-type flash memory device according to the first embodiment and a method for producing the device.
Figure 2K:
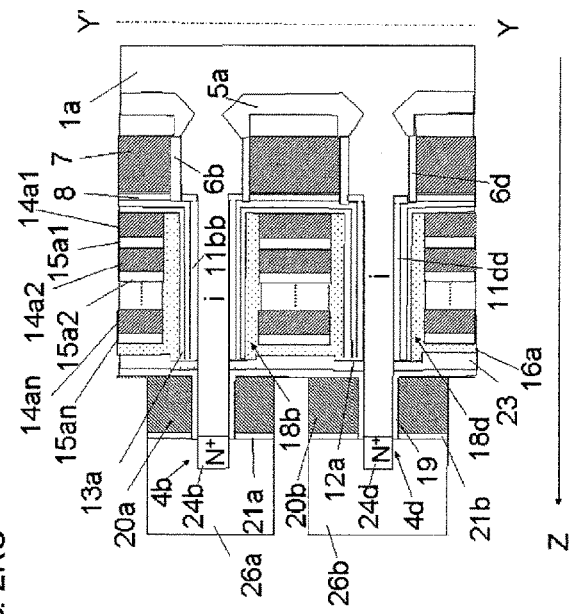
Figure 2K:
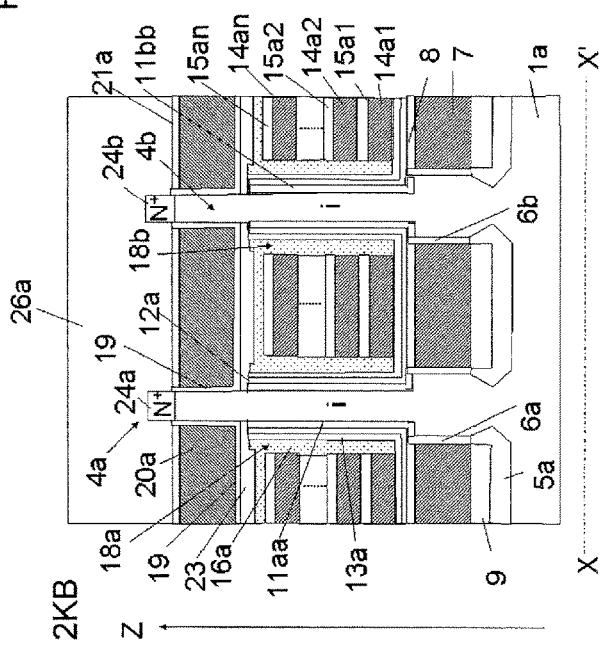

Next, as illustrated in FIGS. 2KA to 2KC, resist layers 26a and 26b extending in the lateral direction in FIG. 2KA so as to cover the Si pillars 4a, 4b, 4c, and 4d are formed by lithography. The resist layer 26a covers the Si pillars 4a and 4b and extends in the lateral direction as illustrated in FIG. 2KA. The resist layer 26b covers the Si pillars 4c and 4d and extends in the lateral direction as illustrated in FIG. 2KA. Subsequently, the SiO$_2$ layer 21 and the doped Si layer 20 are etched from the upper surface by RIE using the resist layers 26a and 26b as a mask. As a result, a SiO$_2$ layer 21a and a doped Si layer 20a are formed under the resist layer 26a. At the same time, a SiO$_2$ layer 21b and a doped Si layer 20b are formed under the resist layer 26b. The resist layers 26a and 26b are then removed.

Figure 2L:
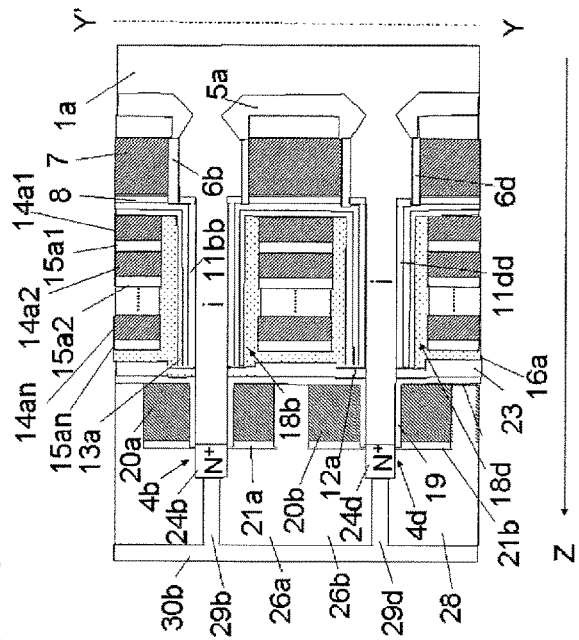
FIG. 2LA and FIGS. 2LB and 2LC are respectively a plan view and sectional structural views illustrating a vertical NAND-type flash memory device according to the first embodiment and a method for producing the device.
Figure 2L:
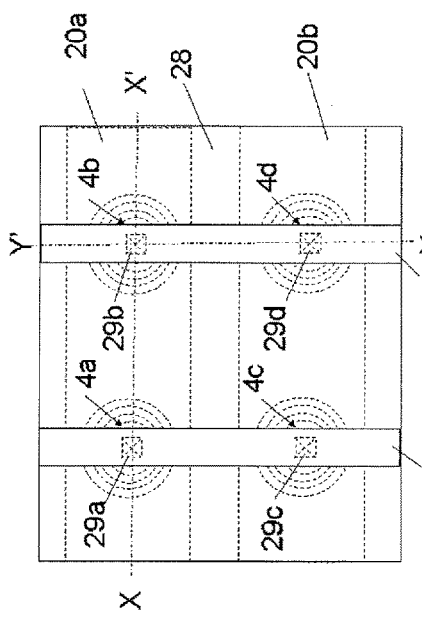
Figure 2L:
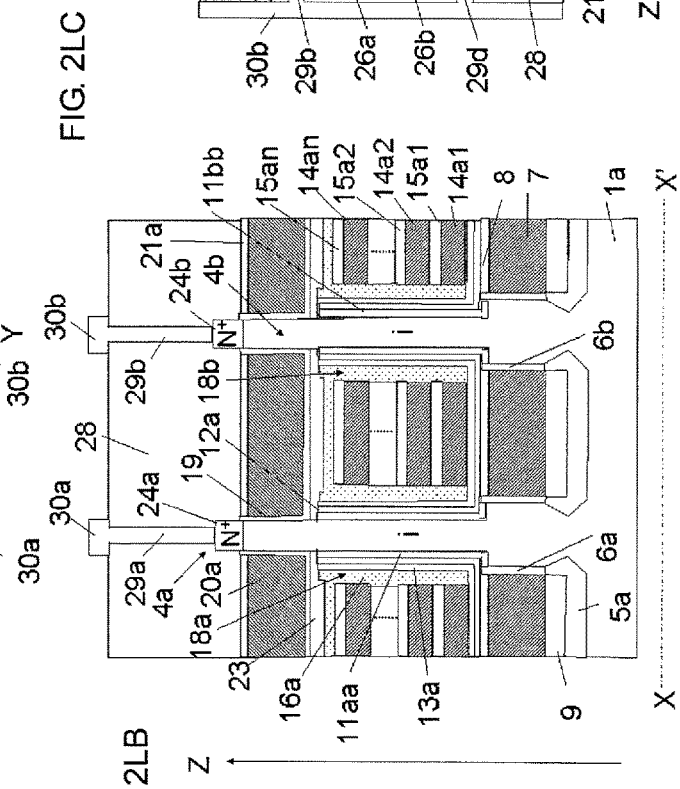

Next, as illustrated in FIGS. 2LA to 2LC, a SiO$_2$ layer 28 is deposited by chemical vapor deposition (CVD) over the entire surface, and contact holes 29a, 29b, 29c, and 29d are formed on the Si pillars 4a, 4b, 4c, and 4d, respectively. Subsequently, metal wiring layers 30a and 30b that are connected to the N$^+$ layers 24a, 24b, 24c, and 24d through the contact holes 29a, 29b, 29c, and 29d are formed so as to extend in a longitudinal direction, as illustrated in FIG. 2LA. The metal wiring layer 30a is connected to the N$^+$ layers 24a and 24c (the N$^+$ layer 24c is not illustrated in the figures) that are respectively formed on the Si pillars 4a and 4c. The metal wiring layer 30b is connected to the N$^+$ layers 24b and 24d that are respectively formed on the Si pillars 4b and 4d. A vertical NAND-type flash memory device is formed as described above.

In FIGS. 2LA to 2LC, the N$^+$ layer 5a functions as a common source, the doped Si layer 7 functions as a source-side selection line, the doped Si layers 14a1, 14a2, and 14an function as word lines, the doped Si layers 20a and 20b function as drain-side selection lines, the N$^+$ layers 24a, 24b, 24c, and 24d function as drains, and the metal wiring layers 30a and 30b function as bit lines. The SiO$_2$ layers 11aa, 11bb, 11cc, and 11dd function as tunnel insulating layers. The Si$_3$N$_4$ layer 12a functions as a data charge storage insulating layer. The SiO$_2$ layer 13a functions as an interlayer insulating layer. The HfO$_2$ layer 16a functions as an insulating layer.

According to the first embodiment, the following advantages are achieved.

1. As illustrated in FIGS. 2FA to 2FC, after the SiO$_2$ layers 11a, 11b, 11c, and 11d functioning as tunnel insulating layers, the Si$_3$N$_4$ layer 12 functioning as a data charge storage insulating layer, and the SiO$_2$ layer 13 functioning as an interlayer insulating layer are formed so as to surround the Si pillars 4a, 4b, 4c, and 4d, a Si material that contains a donor or acceptor impurity and a SiO$_2$ material are incident in a direction perpendicular to the surface of the i-layer substrate 1a by a bias sputtering method. Thus, the doped Si layers 14a1, 14a2, and 14an and the SiO$_2$ layers 15a1, 15a2, and 15an are formed on outer peripheries of the Si pillars 4a, 4b, 4c, and 4d. In this case, since the Si$_3$N$_4$ layers 2a, 2b, 2c, and 2d function as a mask, atoms of the Si material that contains the donor or acceptor impurity and atoms of the SiO$_2$ material, the atoms being incident in a direction perpendicular to the surface of the i-layer substrate 1a, are not incident on the surface of the SiO$_2$ layer 13 disposed on the side surfaces of the Si pillars 4a, 4b, 4c, and 4d. Therefore, the SiO$_2$ layers 11a, 11b, 11c, and 11d functioning as tunnel insulating layers, the Si$_3$N$_4$ layer 12 functioning as a data charge storage insulating layer, and the SiO$_2$ layer 13 functioning as an interlayer insulating layer are not damaged by the incidence of atoms of the Si material and atoms of the SiO$_2$ material. As a result, defects generated in the SiO$_2$ layers 11a, 11b, 11c, and 11d, the Si$_3$N$_4$ layer 12, and the SiO$_2$ layer 13 can be reduced to improve the reliability of memory characteristics.

2. The spaces 18a, 18b, 18c, and 18d are filled with the HfO$_2$ layer 16a which is an insulating layer. Since the HfO$_2$ layer 16a is provided between the doped Si layers 14a1, 14a2, and 14an functioning as word lines and the Si$_3$N$_4$ layer 12a functioning as a data charge storage insulating layer, it is possible to prevent a decrease in data retention characteristics caused by charge injection from the doped Si layers 14a1, 14a2, and 14an functioning as word lines to the Si$_3$N$_4$ layer 12a functioning as a data charge storage insulating layer.

3. The spaces 18a, 18b, 18c, and 18d are sealed by the HfO$_2$ layer 16 functioning as an insulating layer, and the Si pillars 4a, 4b, 4c, and 4d are supported by the HfO$_2$ layer 16. With this structure, it is possible to prevent the occurrence of contamination defects due to a phenomenon in which, in a subsequent cleaning treatment step, a lithography step, and other steps, a treatment liquid enters the spaces 18a, 18b, 18c, and 18d and remains in the spaces without being removed. Furthermore, this structure prevents the Si pillars 4a, 4b, 4c, and 4d from tilting or bending.

Second Embodiment

A method for producing a vertical NAND-type flash memory device according to a second embodiment of the present invention will be described with reference to FIGS. 3AA to 3AC. The method according to the second embodiment is the same as that according to the first embodiment except for a step described with reference to FIGS. 3AA to 3AC.

As illustrated in FIGS. 3A to 3C, as in the step illustrated in FIGS. 2FA to 2FC, atoms of a Si material that contains a donor or acceptor impurity and atoms of a SiO$_2$ material are allowed to be incident in a direction perpendicular to an upper surface of an i-layer substrate 1a by, for example, a bias sputtering method to form doped Si layers 14a1, 14a2, and 14an and SiO$_2$ layers 15a1, 15a2, and 15an on outer peripheries of Si pillars 4a, 4b, 4c, and 4d. Subsequently, heat treatment is performed, for example, at 450° C. in an atmosphere of a gas containing hydrogen (H$_2$). This heat treatment is performed in a state in which hydrogen gas fills upper portions to bottom portions of the spaces 18a, 18b, 18c, and 18d which are gas layers. Subsequently, the steps illustrated in FIGS. 2GA to 2LC are performed.

According to the second embodiment, heat treatment is performed in a state in which hydrogen gas fills the upper portions to the bottom portions of the spaces 18a, 18b, 18c, and 18d. Therefore, hydrogen ions easily diffuse in a SiO$_2$ layer 13 functioning as an interlayer insulating layer, and uncombined hands (dangling bonds) in the SiO$_2$ layer 13 are inactivated. Consequently, insulating properties of the SiO$_2$ layer 13 improve, and the reliability of memory characteristics improves.

Third Embodiment

A method for producing a vertical NAND-type flash memory device according to a third embodiment of the present invention will be described with reference to FIGS. 4AA to 4BC. The method according to the third embodiment is the same as that according to the first embodiment except for steps described with reference to FIGS. 4AA to 4BC.

Figure 4A:
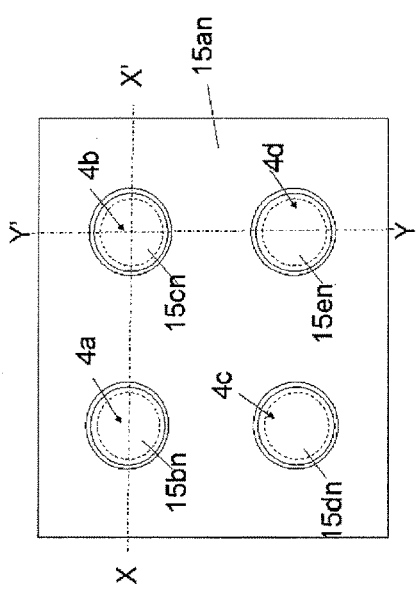
FIG. 4AA and FIGS. 4AB and 4AC are respectively a plan view and sectional structural views illustrating a vertical NAND-type flash memory device according to a third embodiment of the present invention and a method for producing the device.
Figure 4A:
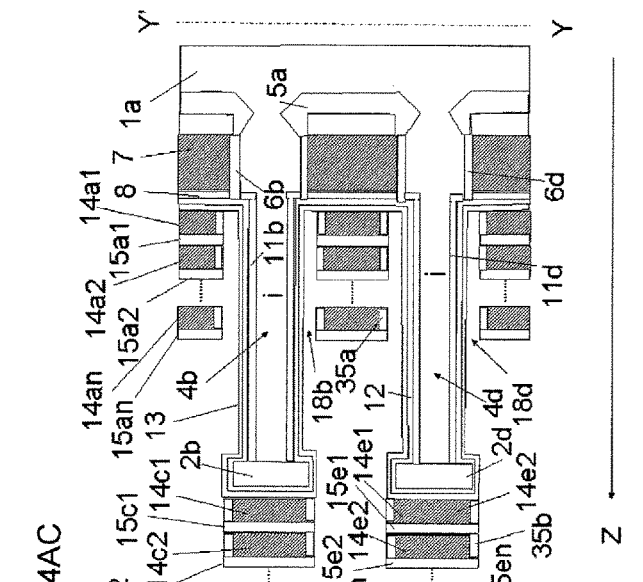
Figure 4A:
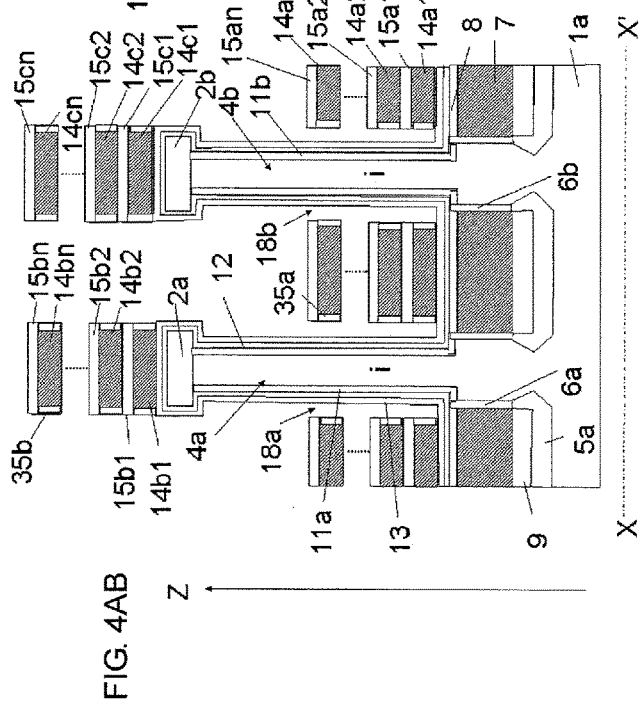

As illustrated in FIGS. 4AA to 4AC, atoms of a Si material that contains a donor or acceptor impurity and atoms of a SiO$_2$ material are allowed to be incident in a direction perpendicular to a surface of an i-layer substrate 1a by, for example, a bias sputtering method. Consequently, doped Si layers 14a1, 14a2, and 14an and SiO$_2$ layers 15a1, 15a2, and 15an are formed on outer peripheries of Si pillars 4a, 4b, 4c, and 4d. Furthermore, doped Si layers 14b1, 14b2, 14bn, 14c1, 14c2, 14cn, 14d1, 14d2, 14dn, 14e1, 14e2, and 14en and SiO$_2$ layers 15b1, 15b2, 15bn, 15c1, 15c2, 15cn, 15d1, 15d2, 15dn, 15e1, 15e2, and 15en are stacked on the Si pillars 4a, 4b, 4c, and 4d. Subsequently, for example, in an oxygen atmosphere at 900° C., a $SiO_2$ layer 35a is formed in surface layers of side surfaces of the doped Si layers 14a1, 14a2, and 14an. At the same time, a $SiO_2$ layer 35b is formed in surface layers of side surfaces of the doped Si layers 14b1, 14b2, 14bn, 14c1, 14c2, 14cn, 14d1, 14d2, 14dn, 14e1, 14e2, and 14en.

Next, as illustrated in FIGS. 4BA to 4BC, a $HfO_2$ layer 16 is formed by, for example, ALD so as to cover the $SiO_2$ layer 15a and the Si pillars 4a, 4b, 4c, and 4d. Since the $HfO_2$ layer 16 is deposited on the exposed surfaces so as to have a substantially uniform thickness, the spaces 18a, 18b, 18c, and 18d are filled with the $HfO_2$ layer 16. Subsequently, the steps illustrated in FIGS. 2HA to 2LC are performed. A vertical NAND-type flash memory device is formed as described above.

According to the third embodiment, the $SiO_2$ layer 35a functioning as an interlayer insulating layer is formed in surface layers of side surfaces of the doped Si layers 14a1, 14a2, and 14an functioning as word lines. Therefore, insulating properties between the $Si_3N_4$ layer 12a functioning as a data charge storage insulating layer and the doped Si layers 14a1, 14a2, and 14an functioning as word lines improve, and the reliability of memory characteristics improves.

Fourth Embodiment

A method for producing a vertical NAND-type flash memory device according to a fourth embodiment of the present invention will be described with reference to FIGS. 5AA to 5CC. In the fourth embodiment, the shape of a material layer deposited by a bias sputtering method will also be described.

Figure 5A:
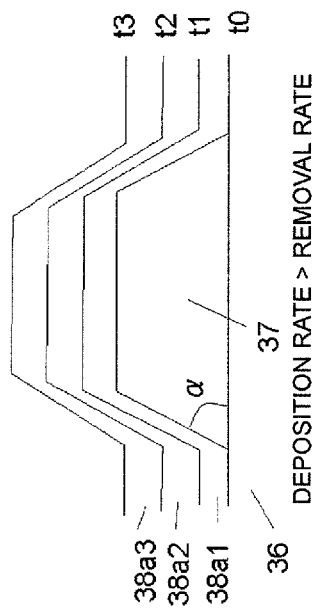
FIGS. 5AA to 5AD are views for illustrating a deposited shape when material atoms are deposited on a pillar having a trapezoidal cross section and formed on a substrate by a bias sputtering method, according to a fourth embodiment of the present invention.
Figure 5A:
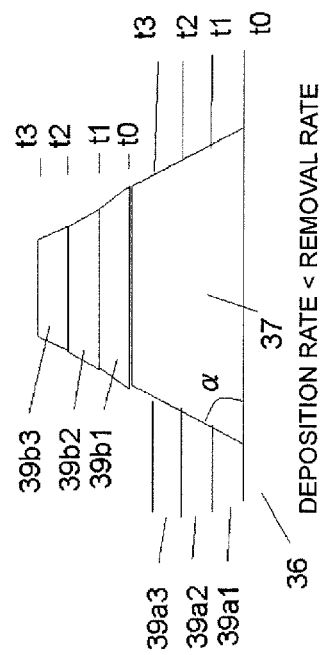
Figure 5A:
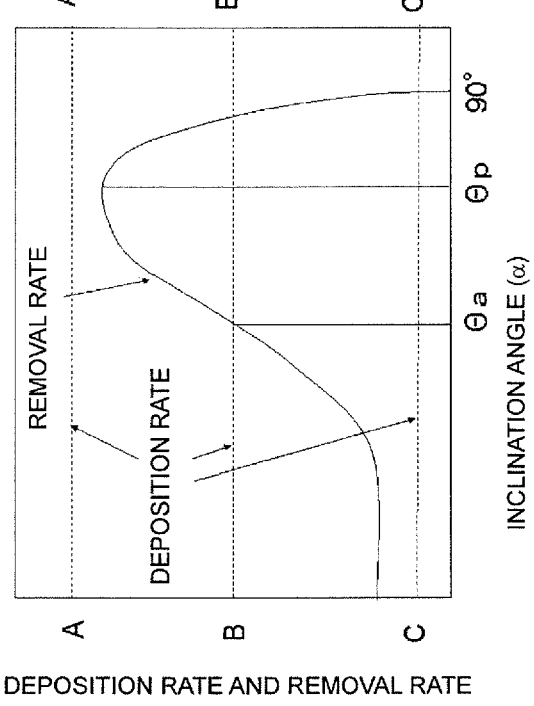
Figure 5A:
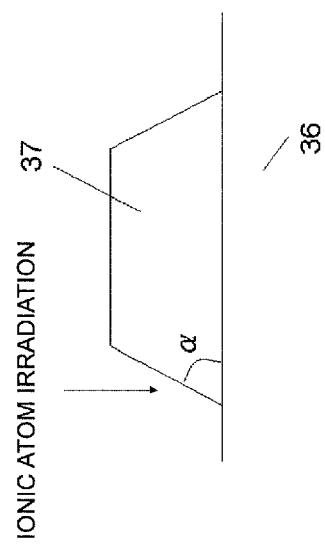

FIGS. 5AA to 5AD illustrate a change with time in a material layer deposited on a truncated cone-shaped pillar 37 formed on a substrate 36, and on the substrate 36 in the outer periphery of the truncated cone-shaped pillar 37, when $SiO_2$ ionic atoms are incident in a direction perpendicular to an upper surface of the substrate 36 using a bias sputtering method (refer to, for example, C. Y. Ting, V. J. Vivalda, and H. G. Schaefer: "Study of planarized sputter-deposited $SiO_2$", J. Vac. Sci. Technol. 15(3), p.p. 1105-1112, May/June (1978), and A. D. G. Stewart, and M. W. Thomson: "Microtopography of Surface Eroded by Ion-Bombardment", Journal of Material Science 4, p.p. 56-69 (1969)).

It is assumed that ionic atoms are incident, from a direction perpendicular to a surface of a substrate 36, on a truncated cone-shaped pillar 37 which is illustrated in FIG. 5AB and whose inclination angle formed by the substrate 36 and a side surface thereof is $\alpha(°)$. In this case, the relationship between the inclination angle $\alpha$ of the side surface of the truncated cone-shaped pillar 37 and a deposition rate of an incident ionic atom material layer on the side surface of the truncated cone-shaped pillar 37, and the relationship between the inclination angle $\alpha$ and a removal rate of the incident ionic atom material layer will be described with reference to FIGS. 5AA to 5AD. The deposition rate depends on the voltage applied between an anode and a cathode in a bias sputtering apparatus and does not depend on the inclination angle $\alpha$. With an increase in the voltage applied, the deposition rate increases. On the other hand, as illustrated in FIG. 5AA, with an increase in the inclination angle $\alpha$, the removal rate increases, becomes maximum at an inclination angle $\alpha=\theta p$, and then decreases. Here, the inclination angle $\theta p$ is 70° or more and 80° or less. The reason why the removal rate increases with an increase in the inclination angle $\alpha$ in this manner is as follows. With an increase in the inclination angle $\alpha$, the length of a path through which an ionic atom enters a material layer that has been deposited increases. In this increased entry path, the opportunity of collision between incident ionic atoms and atoms of the deposited material layer increases, and thus a larger number of atoms of the deposited material layer are released. In contrast, when the inclination angle $\alpha$ exceeds $\theta p$, it becomes difficult for ionic atoms to enter a material layer that has been deposited, and a larger number of ionic atoms are reflected at a surface of the deposited material layer. Thus, the opportunity of collision between incident ionic atoms and atoms of the deposited material layer decreases, and the removal rate decreases. As illustrated in FIG. 5AA, in the case of a deposition rate of A-A', the deposition rate is higher than the removal rate without depending on the inclination angle $\alpha$. In the case of a deposition rate of B-B', at an inclination angle $\alpha$ ($\alpha<\theta a$) which is smaller than an inclination angle $\theta a$ at which the deposition rate is equal to the removal rate, the deposition rate is higher than the removal rate, and at an inclination angle $\alpha$ ($\alpha>\theta a$) which is larger than the inclination angle $\theta a$, the removal rate is higher than the deposition rate. In the case of a deposition rate of C-C', at almost all inclination angles $\alpha$, the removal rate is higher than the deposition rate. As illustrated in FIG. 5AC, under a condition in which the deposition rate is higher than the removal rate, deposited material layers 38a1, 38a2, and 38a3 deposited on the truncated cone-shaped pillar 37 and on the substrate 36 located in the outer periphery of the truncated cone-shaped pillar 37 are formed on the substrate 36 and on side surfaces and a top surface of the truncated cone-shaped pillar 37 in a continuous manner with the lapse of time t0 (before the start of deposition), t1, t2, and t3. In contrast, as illustrated in FIG. 5AD, under a condition in which the deposition rate is lower than the removal rate, since the removal rate on the side surfaces of the truncated cone-shaped pillar 37 is high, deposited material layers 39a1, 39a2, and 39a3 deposited on the substrate 36 and deposited material layers 39b1, 39b2, and 39b3 deposited on the truncated cone-shaped pillar 37 are formed to be isolated from each other. Accordingly, the shape of a material layer deposited on the top surface of the truncated cone-shaped pillar 37 and on side surfaces thereof can be changed by variously changing the inclination angle $\alpha$ of the side surfaces of the truncated cone-shaped pillar 37 and changing the setting of the deposition rate.

A method for producing a vertical NAND-type flash memory device according to the fourth embodiment of the present invention will be described with reference to FIGS. 5BA to 5CC. The method according to the fourth embodiment is the same as that according to the first embodiment except for steps described with reference to FIGS. 5BA to 5CC.

As illustrated in FIGS. 5BA to 5BC, truncated cone-shaped $Si_3N_4$ layers 2A, 2B, 2C, and 2D having side surfaces with an inclination angle of $\beta$ are formed instead of the $Si_3N_4$ layers 2a, 2b, 2c, and 2d that are formed on the Si pillars 4a, 4b, 4c, and 4d, respectively, and illustrated in FIGS. 2EA to 2EC. Subsequently, $SiO_2$ layers 11a, 11b, 11c, and 11d (the $SiO_2$ layer 11c is not illustrated in the figures) which are to become tunnel insulating layers are formed in surface layers of side surfaces of Si pillars 4a, 4b, 4c, and 4d. A $Si_3N_4$ layer 12 functioning as a data charge storage insulating layer and a $SiO_2$ layer 13 functioning as an interlayer insulating layer are further formed so as to cover the whole surface.

Next, as illustrated in FIGS. 5CA to 5CC, atoms of a Si material that contains a donor or acceptor impurity and atoms of a $SiO_2$ material are allowed to be incident in a direction perpendicular to a surface of an i-layer substrate 1a by, for example, a bias sputtering method under a condition in which the deposition rate is lower than the removal rate with respect to the inclination angle β of the truncated cone-shaped $Si_3N_4$ layers 2A, 2B, 2C, and 2D, as illustrated in FIG. 5AD. Consequently, doped Si layers 14a1, 14a2, and 14an and $SiO_2$ layers 15a1, 15a2, and 15an are formed on outer peripheries of the Si pillars 4a, 4b, 4c, and 4d. At the same time, cone-shaped stacked material layers 41a, 41b, 41c, and 41d each having a truncated cone shape and including doped Si layers and $SiO_2$ layers that form a multilayer structure are formed on the Si pillars 4a, 4b, 4c, and 4d, respectively. After the shape of each of the cone-shaped stacked material layers 41a, 41b, 41c, and 41d becomes a cone shape, the incident Si material and $SiO_2$ material are no longer deposited on the cone-shaped stacked material layers 41a, 41b, 41c, and 41d. Accordingly, a height Lb of each of the cone-shaped stacked material layers 41a, 41b, 41c, and 41d is smaller than a thickness La that is the total of the thicknesses of the doped Si layers 14a1, 14a2, and 14an and the $SiO_2$ layers 15a1, 15a2, and 15an, all of which are formed around the outer peripheries of the Si pillars 4a, 4b, 4c, and 4d. Subsequently, the steps illustrated in FIGS. 2GA to 2LC are performed.

In the first embodiment, the total of the thicknesses of the doped Si layers 14b1, 14b2, 14bn, 14c1, 14c2, 14cn, 14d1, 14d2, 14dn, 14e1, 14e2, and 14en and the $SiO_2$ layers 15b1, 15b2, 15bn, 15c1, 15c2, 15cn, 15d1, 15d2, 15dn, 15e1, 15e2, and 15en, which are formed on the Si pillars 4a, 4b, 4c, and 4d, is substantially equal to the thickness La that is the total of the thicknesses of the doped Si layers 14a1, 14a2, and 14an and the $SiO_2$ layers 15a1, 15a2, and 15an. In the case of a large thickness La, defects such as falling and bending of the doped Si layers 14b1, 14b2, 14bn, 14c1, 14c2, 14cn, 14d1, 14d2, 14dn, 14e1, 14e2, and 14en and the $SiO_2$ layers 15b1, 15b2, 15bn, 15c1, 15c2, 15cn, 15d1, 15d2, 15dn, 15e1, 15e2, and 15en are easily generated in a subsequent step such as a cleaning step. In contrast, according to the fourth embodiment, the height Lb of each of the cone-shaped stacked material layers 41a, 41b, 41c, and 41d is smaller than the thickness La of the total of the doped Si layers 14a1, 14a2, and 14an and the $SiO_2$ layers 15a1, 15a2, and 15an, all of which are formed around the outer peripheries of the Si pillars 4a, 4b, 4c, and 4d. Accordingly, it is possible to prevent defects such as falling and bending of the cone-shaped stacked material layers 41a, 41b, 41 c, and 41d from occurring in a subsequent step such as a cleaning step.

Fifth Embodiment

A method for producing a vertical NAND-type flash memory device according to a fifth embodiment of the present invention will be described with reference to FIGS. 6A to 6C. The method according to the fifth embodiment is the same as that according to the first embodiment except for a step described with reference to FIGS. 6A to 6C.

Figure 6A:
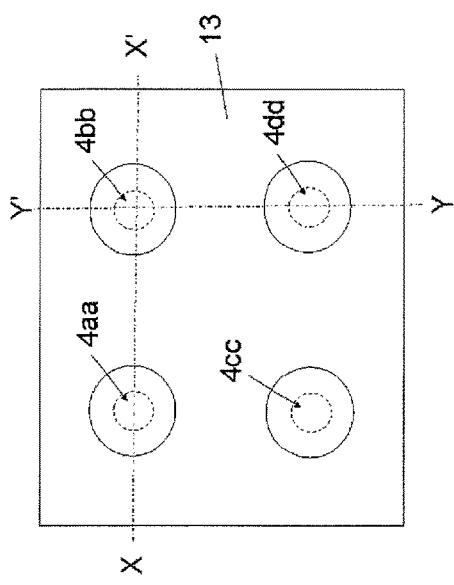
FIG. 6A and FIGS. 6B and 6C are respectively a plan view and sectional structural views illustrating a vertical NAND-type flash memory device according to a fifth embodiment of the present invention and a method for producing the device.
Figure 6C:
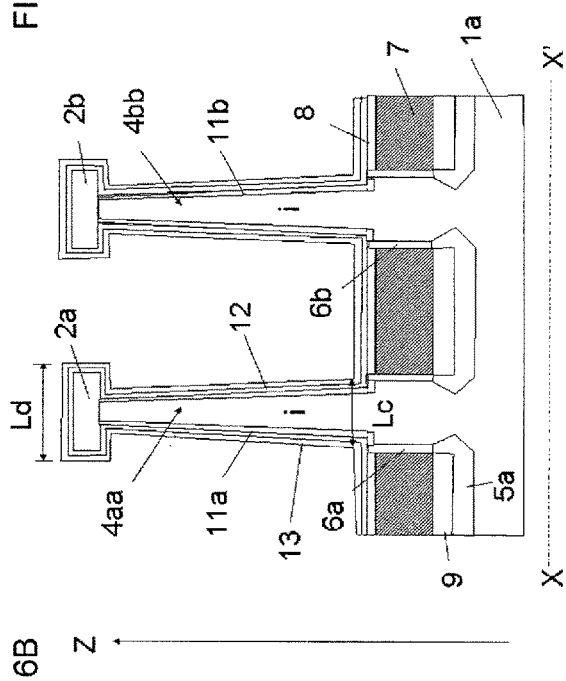
Figure 6B:
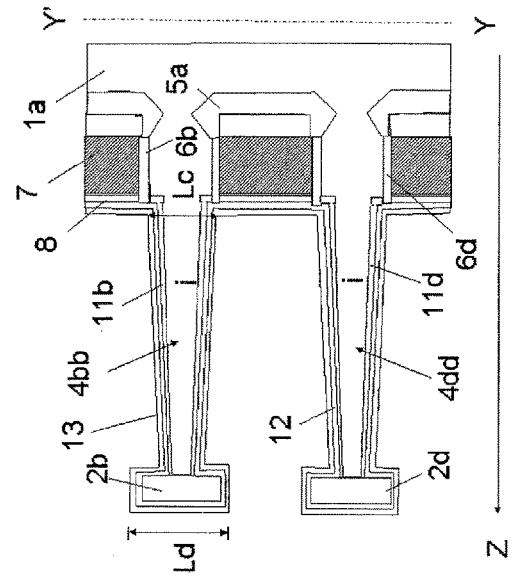

As illustrated in FIGS. 6A to 6C, truncated cone-shaped Si pillars 4aa, 4bb, 4cc, and 4dd each having a truncated cone shape are respectively formed instead of the Si pillars 4a, 4b, 4c, and 4d, whose inclination angle is perpendicular to an upper surface of the i-layer substrate 1a. In each of the truncated cone-shaped Si pillars 4aa, 4bb, 4cc, and 4dd, the diameter of a bottom portion is larger than the diameter of a top portion. Next, $SiO_2$ layers 11a, 11b, 11c, and 11d (the $SiO_2$ layer 11c is not illustrated in the figures) functioning as tunnel insulating layers are formed by, for example, a thermal oxidation method in surface layers of the side surfaces of the truncated cone-shaped Si pillars 4aa, 4bb, 4cc, and 4dd. A $Si_3N_4$ layer 12 functioning as a data charge storage insulating layer and a $SiO_2$ layer 13 functioning as an interlayer insulating layer are further formed so as to cover the whole surface. In this embodiment, the device is formed such that a diameter Lc of a bottom outer peripheral circle of the $SiO_2$ layer 13 formed around the bottom of each of the truncated cone-shaped Si pillars 4aa, 4bb, 4cc, and 4dd is smaller than a diameter Ld of an outer peripheral circle of the $SiO_2$ layer 13 formed around each of the side surfaces of $Si_3N_4$ layers 2a, 2b, 2c, and 2d. Accordingly, as in the structure illustrated in FIGS. 2LA to 2LC of the first embodiment, a $HfO_2$ layer 16 embedded in spaces 18a, 18b, 18c, and 18d is continuously formed in regions extending from bottom portions to upper portions of the Si pillars 4a, 4b, 4c, and 4d, the regions facing the side surfaces of the doped Si layers 14a1, 14a2, and 14an and the $SiO_2$ layers 15a1, 15a2, and 15an. With this structure, the side surfaces of the doped Si layers 14a1, 14a2, and 14an and the $SiO_2$ layers 15a1, 15a2, and 15an are not in contact with the side surface of the $SiO_2$ layer 13 which is an interlayer insulating layer surrounding the Si pillars 4a, 4b, 4c, and 4d (the truncated cone-shaped Si pillars 4aa, 4bb, 4cc, and 4dd in FIGS. 6A to 6C) in the spaces 18a, 18b, 18c, and 18d.

In the fifth embodiment, atoms of a Si material that contains a donor or acceptor impurity and atoms of a $SiO_2$ material are incident in a direction perpendicular to the upper surface of the i-layer substrate 1a by a bias sputtering method to deposit the doped Si layers 14a1, 14a2, and 14an and the $SiO_2$ layers 15a1, 15a2, and 15an on outer peripheries of the truncated cone-shaped Si pillars 4aa, 4bb, 4cc, and 4dd. In this case, as in the spaces 18a, 18b, 18c, and 18d of the first embodiment, spaces are formed between the side surfaces of the truncated cone-shaped Si pillars 4aa, 4bb, 4cc, and 4dd and the side surfaces of the doped Si layers 14a1, 14a2, and 14an and the $SiO_2$ layers 15a1, 15a2, and 15an. With this structure, according to the fifth embodiment, the advantages the same as those in the first embodiment are obtained. The shape of each of the Si pillars 4a, 4b, 4c, and 4d is not necessarily a truncated cone shape as described above. The Si pillars may be barrel-shaped Si pillars in which the maximum diameter among the outer peripheral circles of the $SiO_2$ layer 13 in a cross section in the horizontal direction, the $SiO_2$ layer 13 being formed on the outer peripheries of the Si pillars 4a, 4b, 4c, and 4d, is smaller than the diameter of the outer peripheral circle of the $SiO_2$ layer 13 formed on the outer peripheries of the $Si_3N_4$ layers 2a, 2b, 2c, and 2d. Also in such a case, the advantages the same as those in the first embodiment are obtained.

Sixth Embodiment

Figure 7A:
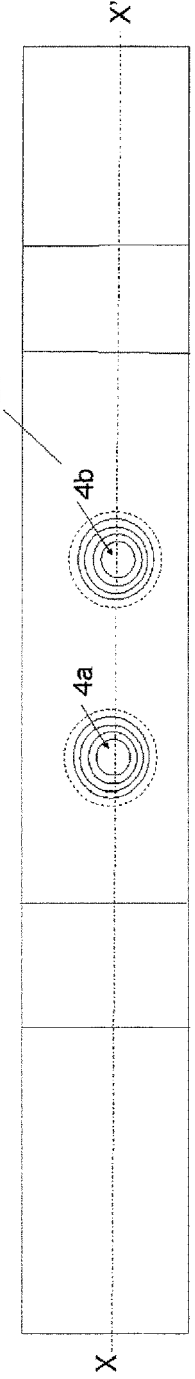
FIGS. 7AA and 7AB are respectively a plan view and a sectional structural view illustrating a vertical NAND-type flash memory device according to a sixth embodiment of the present invention and a method for producing the device.
Figure 7A:
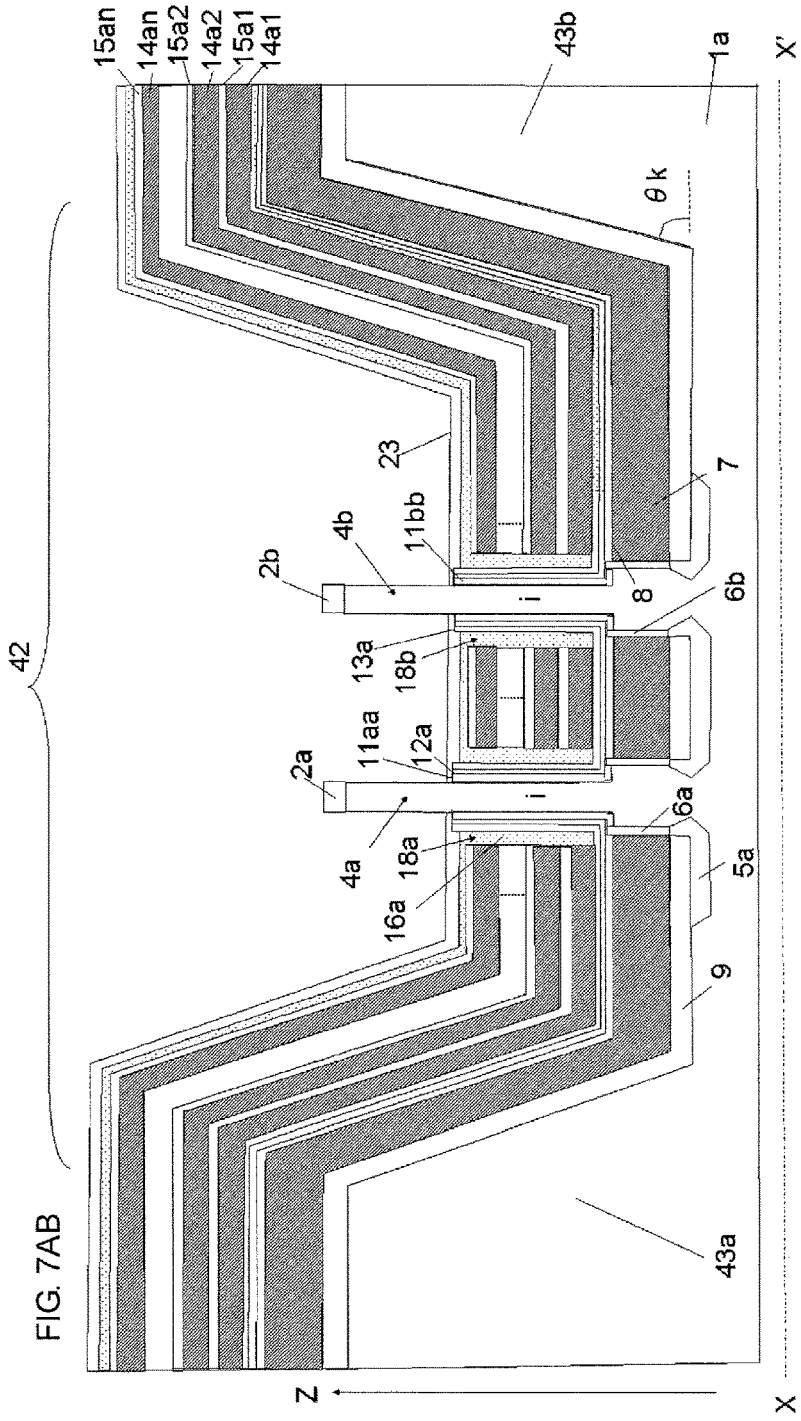

A method for producing a vertical NAND-type flash memory device according to a sixth embodiment of the present invention will be described with reference to FIGS. 7AA to 7HB. In FIGS. 7AA to 7HB, the drawings whose last reference character is A are plan views, and the drawings whose last reference character is B are sectional structural views taken along line X-X' in the drawings whose last reference character is A. Silicon (Si) pillars 4a and 4b correspond to the Si pillars 4a and 4b in FIGS. 2BA to 2LC.

As illustrated in FIGS. 7AA and 7AB, on an outer periphery of a memory element region 42 in which Si pillars 4a and 4b are formed, outer peripheral i-layers 43a and 43b (the outer peripheral i-layers 43a and 43b are connected to each other in the outer periphery of the memory element region 42) that are inclined at an inclination angle θk with respect to an i-layer substrate 1a are formed. Subsequently, the steps illustrated in FIGS. 2CA to 2HC are performed to form an N⁺ layer 5a, a SiO₂ layer 9, SiO₂ layers 6a and 6b, a doped Si layer 7, SiO₂ layers 11aa and 11bb, a Si₃N₄ layer 12a, a SiO₂ layer 13a, doped Si layers 14a1, 14a2, and 14an, and SiO₂ layers 15a1, 15a2, and 15an. Subsequently, a HfO₂ layer 16a and a SiO₂ layer 23 are formed so as to cover outer peripheries of the Si pillars 4a and 4b. The HfO₂ layer 16a fills spaces 18a and 18b that are respectively disposed on the outer peripheries of the Si pillars 4a and 4b.

Silicon nitride (Si₃N₄) layers 2a and 2b are then left on the Si pillars 4a and 4b, respectively. The SiO₂ layer 9, the doped Si layer 7, the doped Si layers 14a1, 14a2, and 14an, the SiO₂ layers 15a1, 15a2, and 15an are formed by, for example, a bias sputtering method by allowing material atoms to be incident in a direction perpendicular to an upper surface of the i-layer substrate 1a. These layers are each deposited by a bias sputtering method under the condition of an inclination angle θk at which the deposition rate is higher than the removal rate, as described with reference to FIG. 5AC. The SiO₂ layers 11aa and 11bb, the Si₃N₄ layer 12a, and the SiO₂ layer 13a are formed by ALD. Consequently, the SiO₂ layer 9, the doped Si layer 7, the Si₃N₄ layer 12a, the SiO₂ layer 13a, the doped Si layers 14a1, 14a2, and 14an, the SiO₂ layers 15a1, 15a2, and 15an, the HfO₂ layer 16a, and the SiO₂ layer 23 are formed in a continuous manner on the outer peripheral i-layers 43a and 43b in the outer peripheries of the Si pillars 4a and 4b.

Next, as illustrated in FIGS. 7BA and 7BB, the doped Si layer 7, the Si₃N₄ layer 12a, the SiO₂ layer 13a, the doped Si layers 14a1, 14a2, and 14an, the SiO₂ layers 15a1, 15a2, and 15an, a HfO₂ layer 16aa, and a SiO₂ layer 23a are formed by lithography and RIE in an area including the Si pillars 4a and 4b so as to extend between the Si pillars 4a and 4b and over the outer peripheral i-layer 43b in a continuous manner.

Next, as illustrated in FIGS. 7CA and 7CB, SiO₂ is deposited by CVD and then planarized by chemical mechanical polishing (CMP). Thus, a SiO₂ layer 45 whose upper surface is located higher than an upper surface of the SiO₂ layer 23a on the outer peripheral i-layer 43b is formed.

Figure 7D:
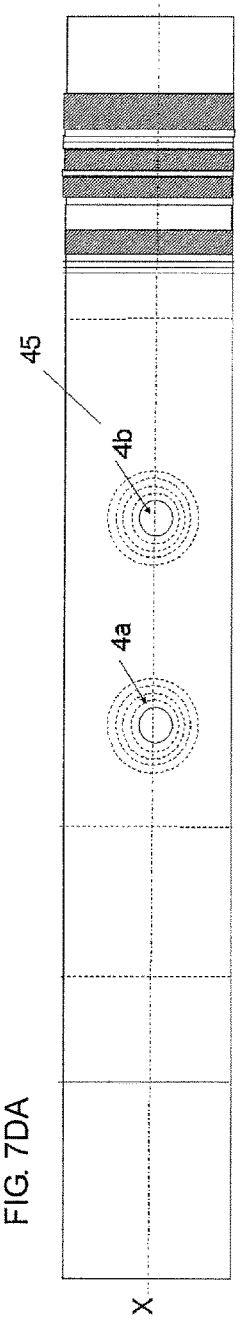
FIGS. 7DA and 7DB are respectively a plan view and a sectional structural view illustrating a vertical NAND-type flash memory device according to the sixth embodiment and a method for producing the device.
Figure 7D:
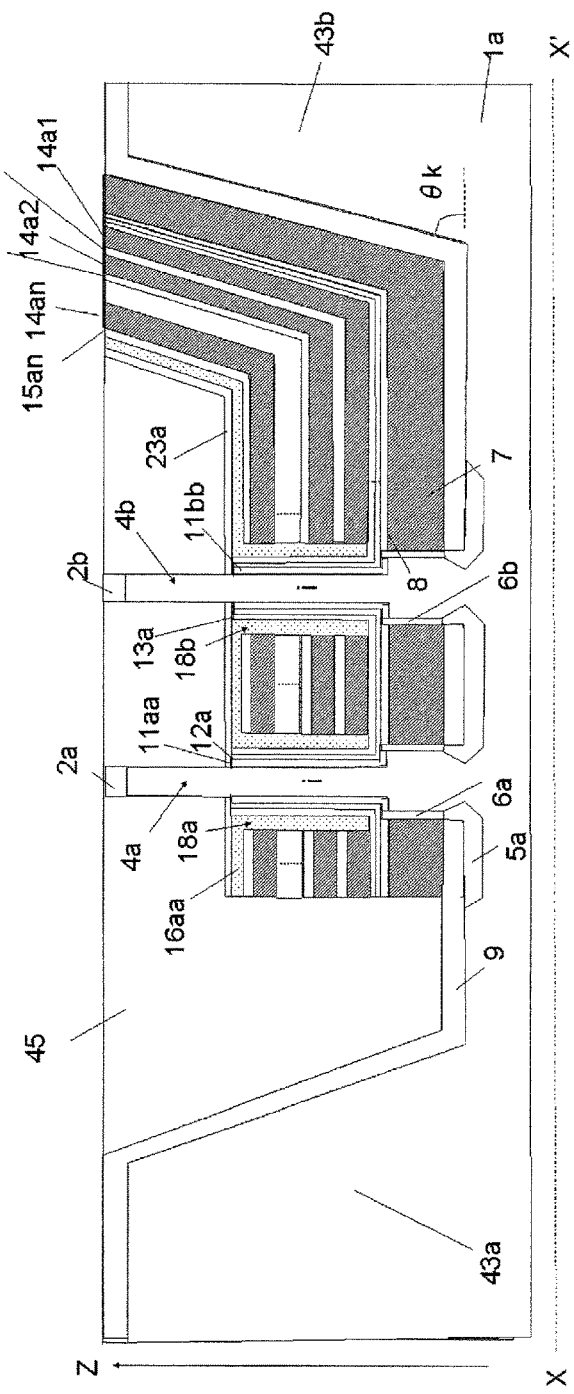

Next, as illustrated in FIGS. 7DA and 7DB, the SiO₂ layer 45, the doped Si layer 7, the Si₃N₄ layer 12a, the SiO₂ layer 13a, the doped Si layers 14a1, 14a2, and 14an, the SiO₂ layers 15a1, 15a2, and 15an, the HfO₂ layer 16aa, and the SiO₂ layer 23a are polished by CMP such that an upper surface thereof has a height substantially equal to that of an upper surface of the SiO₂ layer 9 on the outer peripheral i-layers 43a and 43b to planarize the surface.

Next, as illustrated in FIGS. 7EA and 7EB, a Si₃N₄ layer 46 which is an insulating layer is formed on the doped Si layer 7, the Si₃N₄ layer 12a, the SiO₂ layer 13a, the doped Si layers 14a1, 14a2, and 14an, the SiO₂ layers 15a1, 15a2, and 15an, and the HfO₂ layer 16aa, and the SiO₂ layer 23a whose upper surfaces are exposed on the outer peripheral i-layer 43b. Subsequently, the SiO₂ layer 9 is etched by lithography and RIE to form SiO₂ layers 47a and 47b. Subsequently, the outer peripheral i-layer 43a is etched by, for example, RIE using the SiO₂ layers 47a and 47b as a mask to form Si pillars 48a and 48b, respectively, such that bottom surfaces of the Si pillars 48a and 48b have a height substantially equal to that of the upper surface of the SiO₂ layer 23a disposed on an outer peripheral portion of the Si pillars 4a and 4b. Subsequently, the SiO₂ layer 45 and SiO₂ layer 9 on the memory element region 42 are etched by, for example, an etch-back method such that the upper surfaces thereof have a height substantially equal to that of the upper surface of the SiO₂ layer 23a.

Figure 7F:
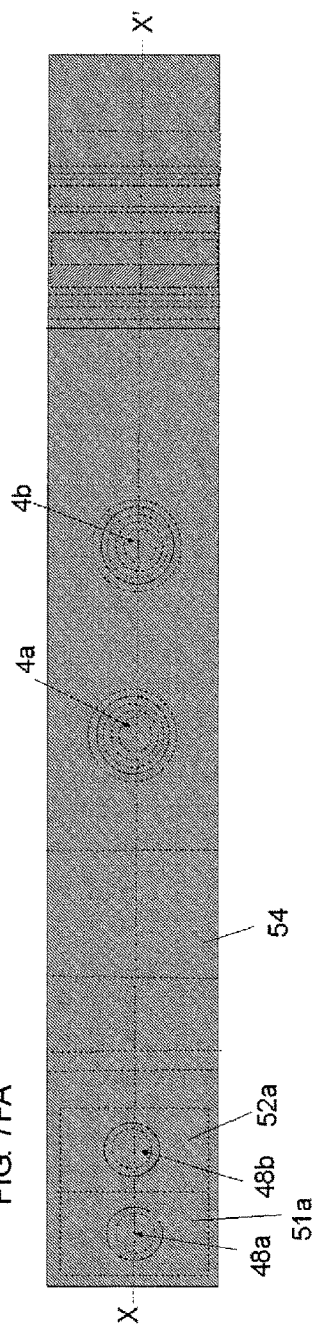
FIGS. 7FA and 7FB are respectively a plan view and a sectional structural view illustrating a vertical NAND-type flash memory device according to the sixth embodiment and a method for producing the device.
Figure 7F:
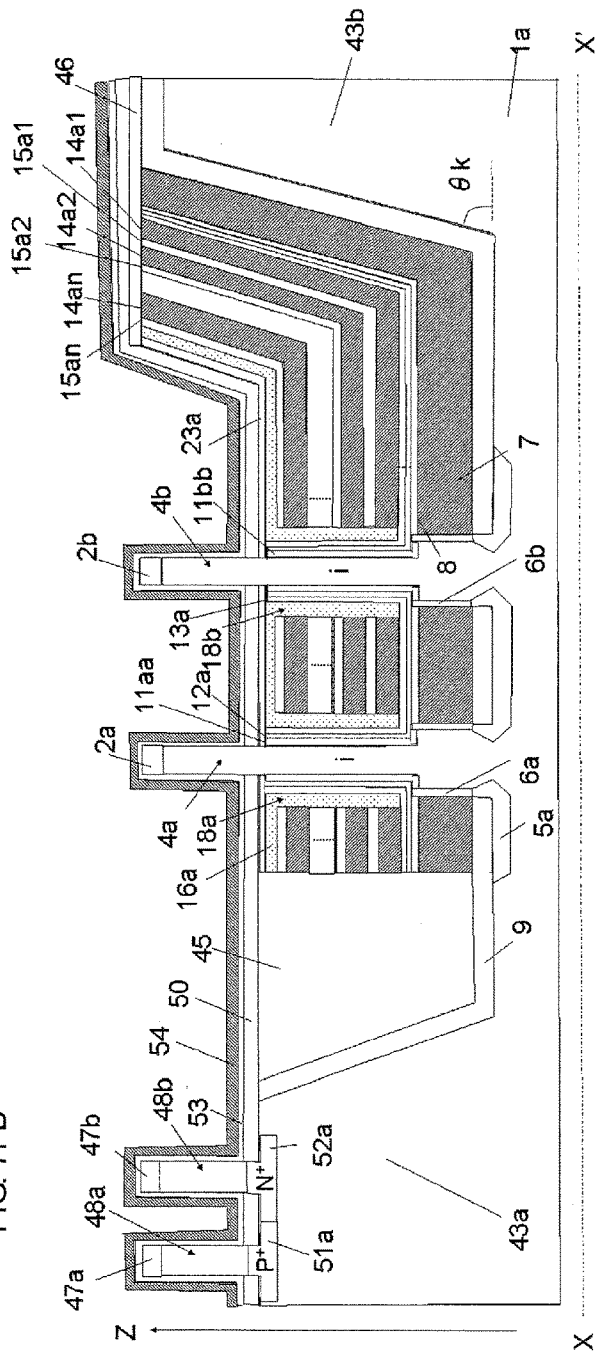

Next, as illustrated in FIGS. 7FA and 7FB, a P⁺ layer 51a is formed in a bottom portion of the Si pillar 48a by lithography, an acceptor impurity ion implantation method, and a thermal diffusion method. Similarly, an N⁺ layer 52a is formed in a bottom portion of the Si pillar 48b by lithography, a donor impurity ion implantation method, and a thermal diffusion method. Subsequently, a SiO₂ layer 50 is formed over the outer peripheries of the Si pillars 4a, 4b, 48a, and 48b. Subsequently, a HfO₂ layer 53 and a TiN layer 54 are deposited by ALD over the entire surface so as to cover the Si pillars 4a, 4b, 48a, and 48b.

Figure 7G:
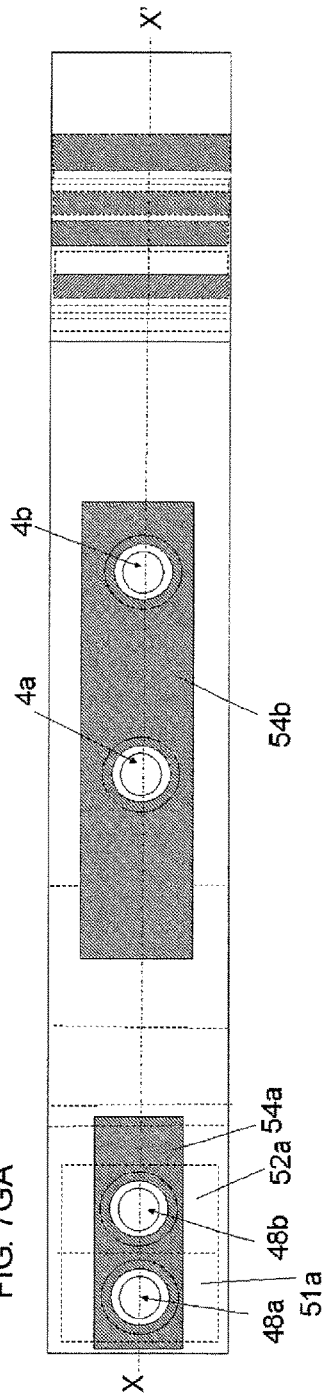
FIGS. 7GA and 7GB are respectively a plan view and a sectional structural view illustrating a vertical NAND-type flash memory device according to the sixth embodiment and a method for producing the device.
Figure 7G:
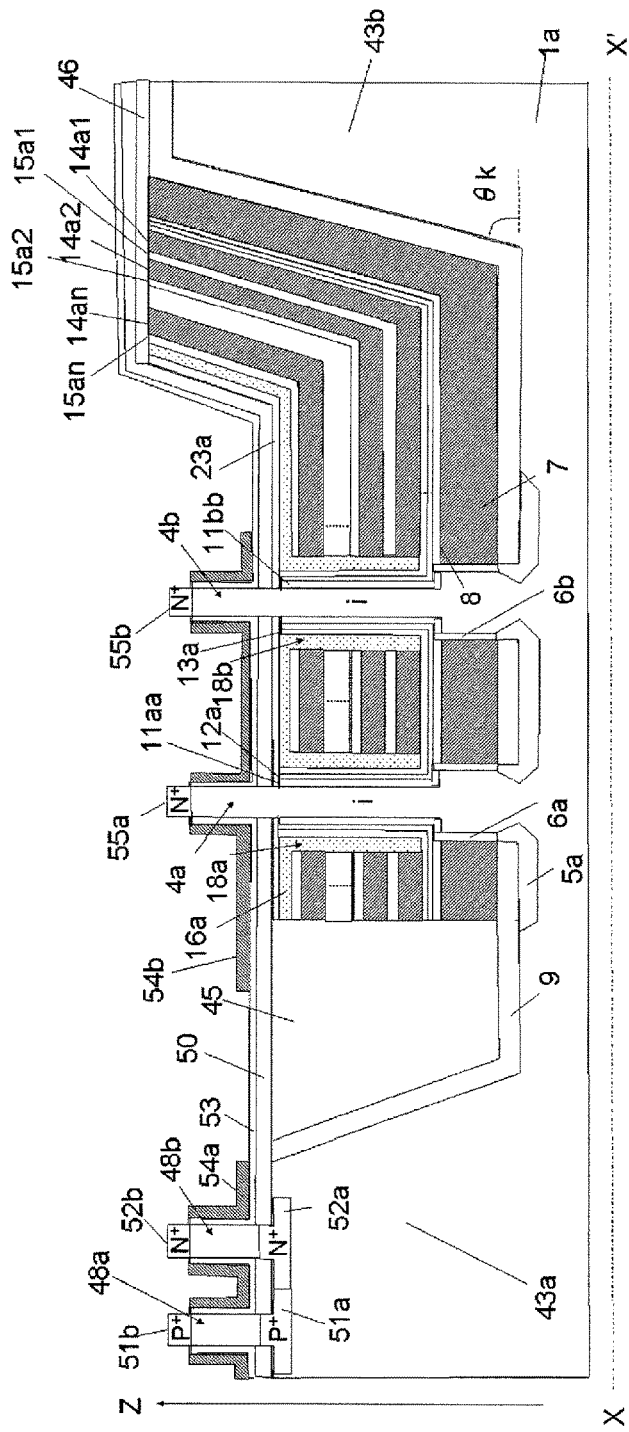

Next, as illustrated in FIGS. 7GA and 7GB, the TiN layer 54 is etched by lithography and RIE to form a TiN layer 54a that surrounds the Si pillars 48a and 48b and that is connected to the Si pillars 48a and 48b. At the same time, a TiN layer 54b that surrounds the Si pillars 4a and 4b and that is connected to the Si pillars 4a and 4b is formed. Subsequently, parts of the HfO₂ layer 53 and the TiN layers 54a and 54b disposed on top portions of the Si pillars 4a, 4b, 48a, and 48b are removed. Subsequently, a P⁺ layer Sib is formed in a top portion of the Si pillar 48a, and N⁺ layers 52b, 55a, and 55b are respectively formed in top portions of the Si pillars 48b, 4a, and 4b by lithography and ion implantation.

Figure 7H:
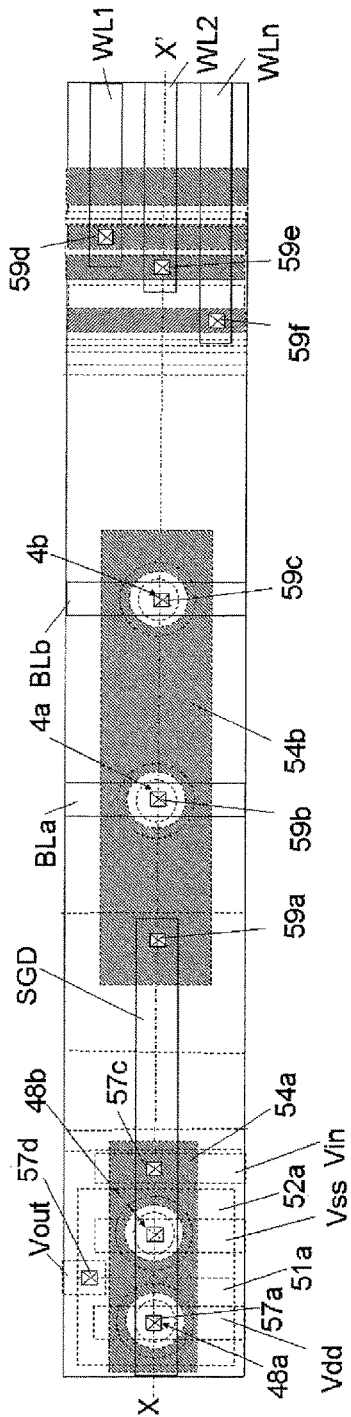
FIGS. 7HA and 7HB are respectively a plan view and a sectional structural view illustrating a vertical NAND-type flash memory device according to the sixth embodiment and a method for producing the device.
Figure 7H:
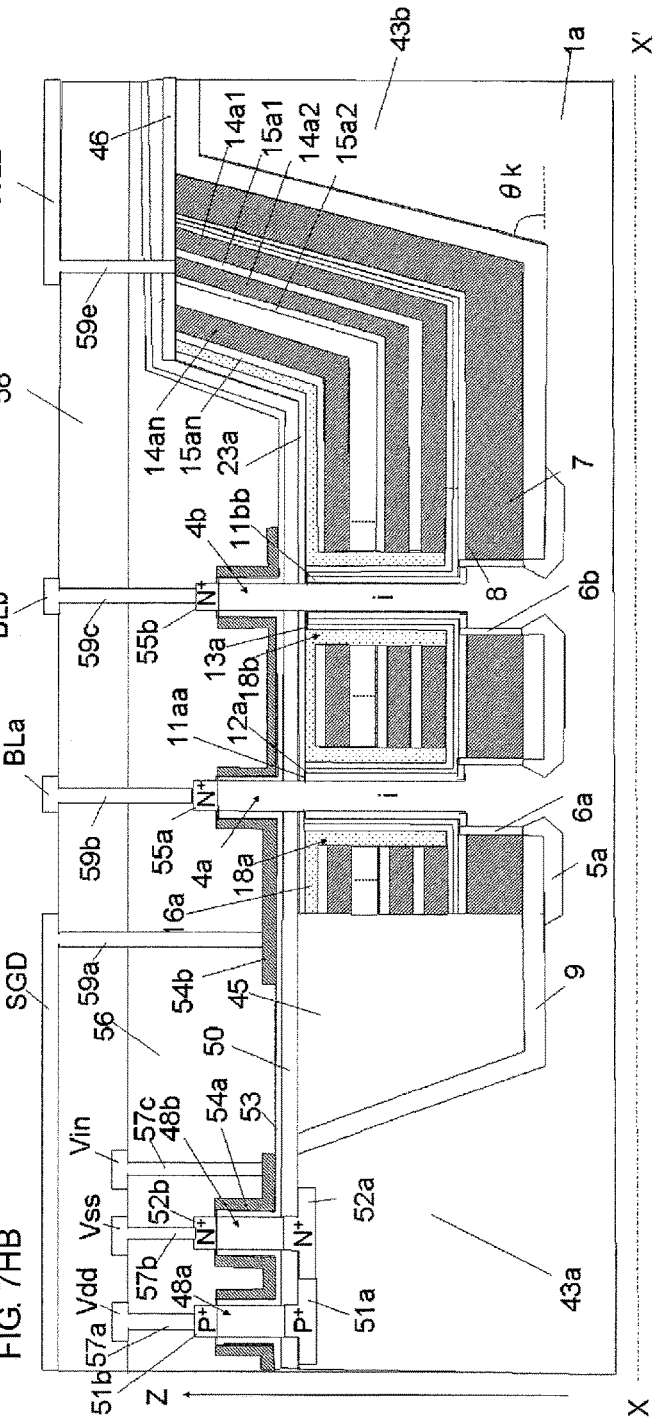

Next, as illustrated in FIGS. 7HA and 7HB, SiO₂ is deposited by CVD, and a SiO₂ layer 56 whose surface is smoothly polished is formed by CMP such that the surface of the SiO₂ layer 56 is located higher than the upper surface of the outer peripheral i-layer 43b. Subsequently, a contact hole 57a is formed on the Si pillar 48a. A contact hole 57b is formed on the Si pillar 48b. A contact hole 57c is formed on the TiN layer 54a. A contact hole 57d is formed on a boundary line between the P⁺ layer 51a and the N⁺ layer 52a that are formed in a surface layer of the outer peripheral i-layer 43a. Subsequently, a power supply wiring metal layer Vdd connected to the P⁺ layer 51b through the contact hole 57a, a ground wiring metal layer Vss connected to the N⁺ layer 52b through the contact hole 57b, an input wiring metal layer Vin connected to the TiN layer 54a through the contact hole 57c, and an output wiring metal layer Vout connected to the P⁺ layer 51a and the N⁺ layer 52a through the contact hole 57d are formed. Subsequently, a SiO₂ layer 58 having a smooth surface is formed by CVD and CMP so as to cover the entire surface. Subsequently, a contact hole 59a is formed on the TiN layer 54b. A contact hole 59b is formed on the Si pillar 4a. A contact hole 59c is formed on the Si pillar 4b. A contact hole 59d is formed on the doped Si layer 14a1 extending to the top of the outer peripheral i-layer 43b. A contact hole 59e is formed on the doped Si layer 14a2 extending to the top of the outer peripheral i-layer 43b. A contact hole 59f is formed on the doped Si layer 14an extending to the top of the outer peripheral i-layer 43b. Subsequently, a drain-side selection gate wiring metal layer SGD connected to the TiN layer 54b through the contact hole 59a, a bit-line wiring metal layer BLa connected to the N⁺ layer 55a through the contact hole 59b, a bit-line wiring metal layer BLb connected to the N⁺ layer 55b through the contact hole 59c, a word-line wiring metal layer WL1 connected to the doped Si layer 14a1 through the contact hole 59d, a word-line wiring metal layer WL2 connected to the doped Si layer 14a2 through the contact hole 59e, and word-line wiring metal layer WLn connected to the doped Si layer 14an through the contact hole 59f are formed. Similarly, the N⁺ layer 5a is connected to a common source wiring layer, and the doped Si layer 7 is connected to a source-side selection gate wiring layer (the common source wiring layer and the source-side selection gate wiring layer are not illustrated in the figures).

As illustrated in FIGS. 7HA and 7HB, a P-channel surrounding gate MOS transistor (SGT) and an N-channel SGT are formed on the outer peripheral i-layer 43a (regarding an SGT, refer to, for example, Japanese Unexamined Patent Application Publication No. 2-188966). In the P-channel SGT, the $P^+$ layer 51a functions as a source, the $P^+$ layer 51b functions as a drain, the Si pillar 48a disposed between the $P^+$ layers 51a and 51b functions as a channel, and the TiN layer 54a functions as a gate. In the N-channel SGT, the $N^+$ layer 52a functions as a source, the $N^+$ layer 52b functions as a drain, the Si pillar 48b disposed between the $N^+$ layers 52a and 52b functions as a channel, and the TiN layer 54a functions as a gate. The P-channel SGT and the N-channel SGT that are respectively formed in the Si pillars 48a and 48b form a CMOS inverter circuit. A vertical NAND-type flash memory device, as illustrated in FIG. 1, in which memory cell-transistors are connected in series in n stages is formed around the Si pillars 4a and 4b in the memory element region 42.

According to the sixth embodiment, the following advantages are achieved.

1. The P-channel SGT formed in the Si pillar 48a, the N-channel SGT formed in the Si pillar 48b, and drain-side selection transistors of the vertical NAND-type flash memory device, the drain-side selection transistors being formed in top portions of the Si pillars 4a and 4b, are formed so as to have heights that are equal to each other. Accordingly, the $HfO_2$ layer 53 functioning as gate insulating layers of the P-channel SGT, the N-channel SGT, and the drain-side selection transistors can be formed at the same time. Similarly, the TiN layer 54a functioning as a gate conductor layer of the P-channel SGT and the N-channel SGT, and the TiN layer 54b functioning as a gate conductor layer of the drain-side selection transistors can be formed at the same time. Similarly, the $N^+$ layer 52b of the N-channel SGT, and the $N^+$ layers 55a and 55b of the vertical NAND-type flash memory device can be formed at the same time. Thus, many steps necessary for forming a peripheral circuit including the P-channel SGT and the N-channel SGT that are formed on the outer peripheral i-layer 43a and many steps necessary for forming the drain-side selection transistors of the vertical NAND-type flash memory device can be performed in common. Accordingly, the cost of the NAND-type flash memory device produced can be reduced.

2. In the vertical NAND-type flash memory device, the doped Si layers 14a1, 14a2, and 14an functioning as word-line conductor layers and the $SiO_2$ layers 15a1, 15a2, and 15an for insulating the doped Si layers 14a1, 14a2, and 14an from each other are formed by allowing material atoms to be incident in a direction perpendicular to a surface of the i-layer substrate 1a by a bias sputtering method. In the Si pillars 4a and 4b, the material atoms are deposited by using the $Si_3N_4$ layers 2a and 2b as a mask under the condition in which the deposition rate of the bias sputtering is higher than the removal rate with respect to the inclination angle θk of the outer peripheral i-layers 43a and 43b. Accordingly, spaces 18a and 18b can be formed on the outer peripheries of the Si pillars 4a and 4b, respectively. In addition, the doped Si layers 14a1, 14a2, and 14an and the $SiO_2$ layers 15a1, 15a2, and 15an are formed so as to conform to a side surface of the outer peripheral i-layer 43b. As a result, the word-line wiring metal layers WL1, WL2, and WLn can be respectively formed through the contact holes 59d, 59e, and 59f, whose bottom surfaces have heights equal to each other.

Therefore, the steps of forming the word-line wiring metal layers WL1, WL2, and WLn are simplified to realize a reduction in the production cost of the NAND-type flash memory device.

Seventh Embodiment

A method for producing a vertical NAND-type flash memory device according to a seventh embodiment of the present invention will be described with reference to FIGS. 8A to 8C. The method according to the seventh embodiment is the same as that according to the first embodiment except for a step described with reference to FIGS. 8A to 8C.

Figure 8C:
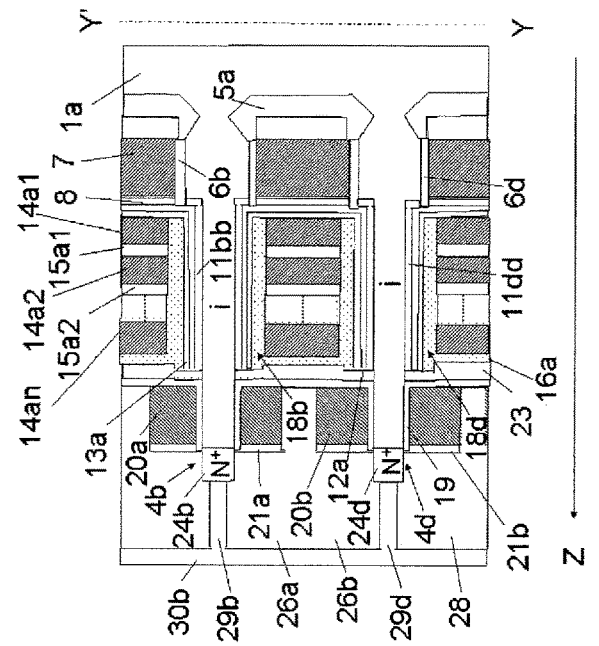
FIG. 8A and FIGS. 8B and 8C are respectively a plan view and sectional structural views illustrating a vertical NAND-type flash memory device according to a seventh embodiment of the present invention and a method for producing the device.
Figure 8A:
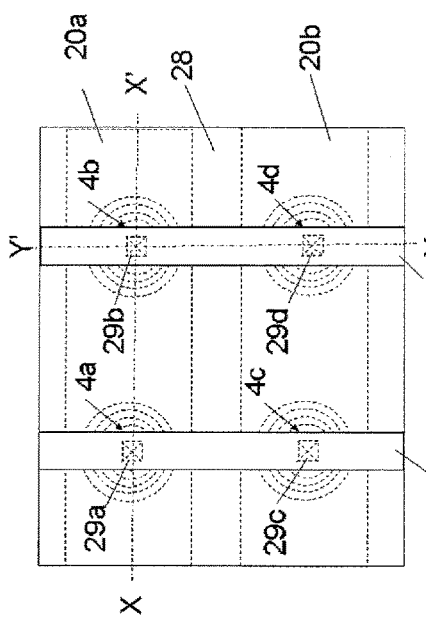
Figure 8B:
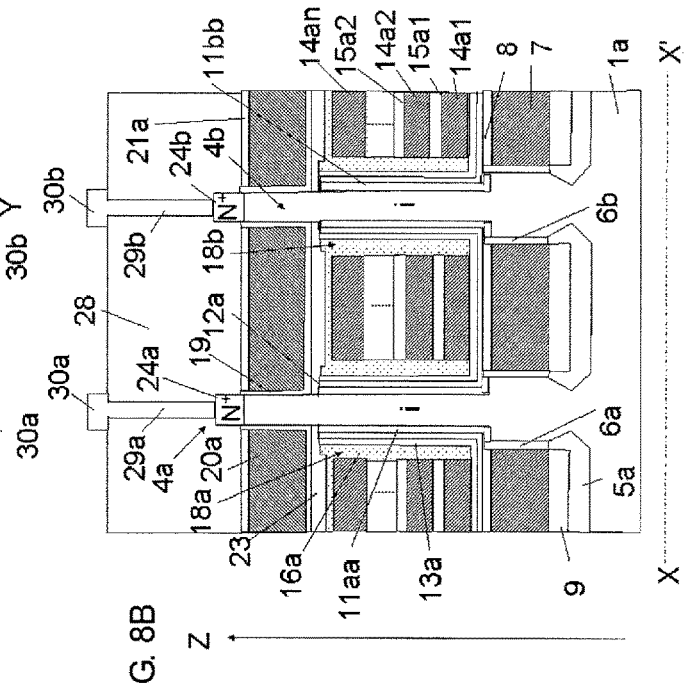
Figure 9:
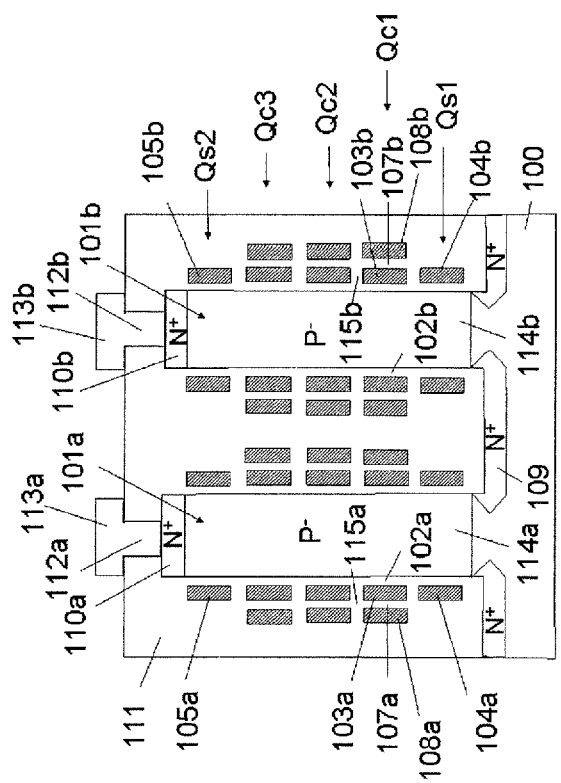
FIG. 9 is a sectional structural view of an example of a vertical NAND-type flash memory device in the related art.

In the seventh embodiment, as illustrated in FIGS. 8A to 8C, doped Si layers 14a1, 14a2, and 14an are formed on outer peripheries of Si pillars 4a, 4b, 4c, and 4d such that an upper surface of the doped Si layer 14an disposed in the uppermost portion is in contact with a $HfO_2$ layer 16a.

In the seventh embodiment, among the $SiO_2$ layers 15a1, 15a2, and 15an illustrated in FIGS. 2LA to 2LC, the $SiO_2$ layer 15an disposed in the uppermost portion is not provided. With this structure, the distance between the doped Si layer 14an functioning as a word line and the doped Si layers 20a and 20b functioning as drain-side selection lines can be reduced. Accordingly, in the channel potentials of memory cell-transistors and drain-side selection transistors, a barrier is not generated between channels.

In the first embodiment, when it is assumed that a doped Si layer 14a1 and a $SiO_2$ layer 15a1 form one set, at least three sets of the doped Si layers 14a1, 14a2, and 14an and the $SiO_2$ layers 15a1, 15a2, and 15an are used in a vertical NAND-type flash memory device. However, such a structure is applicable to other electrically erasable programmable read only memory (EEPROM) devices, such as NOR-type memory devices, including one set of the doped Si layer 14a1 and the $SiO_2$ layer 15a1. This is also similarly applicable to other embodiments of the present invention.

In the first embodiment, atoms of a Si material that contains a donor or acceptor impurity and atoms of a $SiO_2$ material are allowed to be incident in a direction perpendicular to the upper surface of the i-layer substrate 1a by a bias sputtering method to form the doped Si layers 14a1, 14a2, and 14an and the $SiO_2$ layers 15a1, 15a2, and 15an on outer peripheries of the Si pillars 4a, 4b, 4c, and 4d. Alternatively, other methods may be used as long as the doped Si layers 14a1, 14a2, and 14an and the $SiO_2$ layers 15a1, 15a2, and 15an can be formed by allowing a Si material that contains a donor or acceptor impurity and a $SiO_2$ material to be incident in a direction perpendicular to the upper surface of the i-layer substrate 1a. This is also similarly applicable to other embodiments of the present invention.

The doped Si layers 14a1, 14a2, and 14an in the first embodiment may be formed of amorphous silicon or polysilicon. This is also similarly applicable to other embodiments of the present invention.

The doped Si layers 14a1, 14a2, and 14an in the first embodiment may be layers formed of a material having electrical conductivity. This is also similarly applicable to other embodiments of the present invention.

The $SiO_2$ layers 11a, 11b, 11c, and 11d functioning as tunnel insulating layers, the $Si_3N_4$ layer 12a functioning as a data charge storage insulating layer, and the $SiO_2$ layer 13a functioning as an interlayer insulating layer in the first embodiment may be layers formed of other materials as long as the layers can achieve the functions of the respective layers. This is also similarly applicable to other embodiments of the present invention.

In the first embodiment, the $Si_3N_4$ layer 12a functioning as a data charge storage insulating layer and the $SiO_2$ layer 13a functioning as an interlayer insulating layer are formed as independent material layers. The layers are not limited thereto. For example, a $Si_3N_4$ layer 12a is formed, and a SiNO layer containing oxygen may subsequently be formed as an interlayer insulating layer by successively introducing oxygen gas. This is also similarly applicable to other embodiments of the present invention.

In the first embodiment, the spaces 18a, 18b, 18c, and 18d are filled with the $HfO_2$ layer 16a. Alternatively, any insulating layer formed of a material other than $HfO_2$ may be used instead of the $HfO_2$ layer 16a as long as the layer fills the spaces 18a, 18b, 18c, and 18d. This is also similarly applicable to other embodiments of the present invention.

In the first embodiment, the doped Si layer 7 is used as an example of a source-side selection gate conductor layer, and the doped Si layer 20a is used as an example of a drain-side selection gate conductor layer. The layers are not limited thereto and may be formed of other materials as long as the layers are conductor layers. This is also similarly applicable to other embodiments of the present invention.

In the first embodiment, a NAND-type flash memory device is formed around the Si pillars 4a, 4b, 4c, and 4d. The pillars are not limited thereto, and other semiconductor pillars may be used. This is also similarly applicable to other embodiments of the present invention.

In the first embodiment, after the resist layers 3a, 3b, 3c, and 3d each having a perfect circular shape are formed, a $Si_3N_4$ layer is etched by, for example, reactive ion etching (ME) using the resist layers 3a, 3b, 3c, and 3d as a mask to form the $Si_3N_4$ layers 2a, 2b, 2c, and 2d, respectively. The shapes of the resist layers 3a, 3b, 3c, and 3d and the $Si_3N_4$ layers 2a, 2b, 2c, and 2d in plan view are not limited to perfect circular shapes and may be, for example, an elliptical shape or a rectangular shape. This is also similarly applicable to other embodiments of the present invention.

In the first embodiment, the i-layer substrate 1 is etched by, for example, ME using both the resist layers 3a, 3b, 3c, and 3d and the $Si_3N_4$ layers 2a, 2b, 2c, and 2d as a mask to form the Si pillars 4a, 4b, 4c, and 4d, respectively. The method is not limited thereto. The i-layer substrate 1 may be etched by using only the resist layers 3a, 3b, 3c, and 3d or the $Si_3N_4$ layers 2a, 2b, 2c, and 2d without using both the resist layers 3a, 3b, 3c, and 3d and the $Si_3N_4$ layers 2a, 2b, 2c, and 2d. Alternatively, a layer formed of another material may be used as long as the layer can achieve the function of the resist layers 3a, 3b, 3c, and 3d and the $Si_3N_4$ layers 2a, 2b, 2c, and 2d. The layer formed of the other material may have a multilayer structure. This is also similarly applicable to other embodiments of the present invention.

In the first embodiment, the doped Si layers 14a1, 14a2, and 14an functioning as word lines, and the doped Si layer 7 functioning as a source-side selection line have a structure in which these layers are formed to be connected to outer peripheries of the Si pillars 4a, 4b, 4c, and 4d. The structure is not limited thereto. In accordance with the specification of the device operation, as in the structure of the doped Si layers 20a and 20b functioning as drain-side selection lines, the doped Si layers 14a1, 14a2, and 14an and the doped Si layer 7 may have a separated structure including doped Si layers that are connected to outer peripheries of the Si pillars 4a and 4b and doped Si layers that are connected to outer peripheries of the Si pillars 4c and 4d. This is also similarly applicable to other embodiments of the present invention.

In the structure described in the first embodiment, the Si pillars 4a, 4b, 4c, and 4d have the $N^+$ layer 5a functioning as a common source in a bottom portion thereof and the $N^+$ layers 24a, 24b, 24c, and 24d functioning as drains in top portions thereof. The structure is not limited thereto. The technical idea of the present invention is also applicable to a vertical NAND-type flash memory device (refer to, for example, the specification of U.S. Pat. No. 8,189,371) in which two Si pillars form a NAND-type flash memory device. In this case, the common source $N^+$ layer 5a and the drain $N^+$ layers 24a, 24b, 24c, and 24d are formed in top portions of the Si pillars 4a, 4b, 4c, and 4d. The channel of the NAND-type flash memory device is formed so as to be connected to a channel of one Si pillar connected to the common source $N^+$ layer and a channel of the other Si pillar, the channel being adjacent to the above channel, disposed in the top portion of the Si pillar, and connected to the drain $N^+$ layer. This is also similarly applicable to other embodiments of the present invention.

The hydrogen heat treatment in the second embodiment has been described using the first embodiment as an example. The hydrogen heat treatment is also similarly applicable to other embodiments of the present invention.

The hydrogen heat treatment in the second embodiment may be performed at any time from the formation of the spaces 18a and 18b to the time at which the spaces 18a and 18b are filled with the $HfO_2$ layer 16. This is also similarly applicable to other embodiments of the present invention.

The technical matter used in the fourth embodiment is also similarly applicable to other embodiments of the present invention.

In the fourth embodiment, the truncated cone-shaped $Si_3N_4$ layers 2A, 2B, 2C, and 2D are formed instead of the $Si_3N_4$ layers 2a, 2b, 2c, and 2d, and the cone-shaped stacked material layers 41a, 41b, 41c, and 41d are formed on the truncated cone-shaped $Si_3N_4$ layers 2A, 2B, 2C, and 2D, respectively. The shape of each of the cone-shaped stacked material layers 41a, 41b, 41c, and 41d is not limited to such a cone shape and may be any tapered shape. This is also similarly applicable to other embodiments of the present invention.

In the sixth embodiment, the Si pillars 48a and 48b are formed such that the bottom surfaces of the Si pillars 48a and 48b have a height substantially equal to that of the upper surface of the $SiO_2$ layer 23a. The structure is not limited thereto. The height of the bottom surfaces of the Si pillars 48a and 48b may be located in the vicinity of the height of the surface of the $SiO_2$ layer 23a as long as SGTs are formed in the Si pillars 48a and 48b.

In the sixth embodiment, a single-layered TiN layer 54 is used. However, the layer is not limited thereto. Instead of the single-layered TiN layer 54, for example, a layer having a two-layer structure including a poly-Si layer, or a plurality of layers formed of other materials may be used.

In the sixth embodiment, the contact holes 59d, 59e, and 59f are formed in the vicinity of the center line X-X' of the Si pillars 4a and 4b in which a NAND-type flash memory device is formed. However, the structure is not limited thereto. Since the doped Si layers 14a1, 14a2, and 14an are formed over the entire memory element region 42 in a continuous manner, the contact holes 59d, 59e, and 59f need not be necessarily formed so as to gather in the vicinity of the line X-X' as illustrated in FIGS. 7HA and 7HB.

In the sixth embodiment, a description has been made of an example of a CMOS inverter circuit including the P-channel SGT and the N-channel SGT formed in the Si pillars 48a and 48b on the outer peripheral i-layer 43a. The structure is not limited thereto. It is to be understood that the technical idea of the present invention is applicable also in the case where a circuit using other SGTs is formed.

According to the present invention, a pillar-shaped semiconductor memory device having a high density and a low cost, and a high-performance, new-function electronic device using the semiconductor memory device are provided.

What is claimed is:

1. A pillar-shaped semiconductor memory device comprising:
   a semiconductor substrate;
   a first semiconductor pillar disposed on the semiconductor substrate and extending in a direction perpendicular to a surface of the semiconductor substrate;
   a tunnel insulating layer surrounding an outer periphery of the first semiconductor pillar;
   a data charge storage insulating layer surrounding an outer periphery of the tunnel insulating layer;
   a first interlayer insulating layer surrounding an outer periphery of the data charge storage insulating layer;
   a second interlayer insulating layer surrounding an outer periphery of the first interlayer insulating layer;
   a first conductor layer surrounding an outer periphery of the second interlayer insulating layer; and
   a third interlayer insulating layer that is in contact with an upper surface or a lower surface of the first conductor layer and that surrounds an outer periphery of the second interlayer insulating layer,
   wherein at least one stacked material layer including the first conductor layer and the third interlayer insulating layer as one set is formed in a direction perpendicular to an upper surface of the semiconductor substrate,
   the second interlayer insulating layer is continuously formed between the first semiconductor pillar and a side surface of the at least one stacked material layer, the side surface facing the first semiconductor pillar, in a direction perpendicular to the at least one stacked material layer and extends to an upper surface of an uppermost layer of the at least one stacked material layer, and
   data writing and erasing due to a data charge transfer between the first semiconductor pillar and the data charge storage insulating layer through the tunnel insulating layer or a data charge retention by the data charge storage insulating layer is performed by application of a voltage to the first conductor layer.

2. The pillar-shaped semiconductor memory device according to claim 1, wherein a thickness of the second interlayer insulating layer disposed on the at least one stacked material layer is larger than ½ of a thickness of the second interlayer insulating layer in contact with the first interlayer insulating layer.

3. The pillar-shaped semiconductor memory device according to claim 1, wherein upper ends of the tunnel insulating layer, the data charge storage insulating layer, and the first interlayer insulating layer in the direction perpendicular to the at least one stacked material layer have a height substantially equal to a height of an upper surface of the second interlayer insulating layer extending to the upper surface of the at least one stacked material layer.

4. The pillar-shaped semiconductor memory device according to claim 1, wherein a portion of the second interlayer insulating layer, the portion extending to the upper surface of the at least one stacked material layer, is in contact with an upper surface of the first conductor layer.

5. The pillar-shaped semiconductor memory device according to claim 1, further comprising an oxide insulating layer between the first conductor layer and the second interlayer insulating layer.

6. The pillar-shaped semiconductor memory device according to claim 1,
   wherein the at least one stacked material layer comprises a plurality of stacked material layers,
   the pillar-shaped semiconductor memory device includes
   a first gate insulating layer formed above the stacked material layers and surrounding an outer periphery of the first semiconductor pillar,
   a second conductor layer surrounding an outer periphery of the first gate insulating layer, and
   a first impurity region formed in a top portion of the first semiconductor pillar and containing a donor or acceptor impurity,
   the first conductor layer of each of the stacked material layers is connected to a word-line wiring metal layer,
   the second conductor layer is connected to a source-side selection gate wiring metal layer or a drain-side selection gate wiring metal layer,
   the first impurity region is connected to a common source line metal layer or a bit-line wiring metal layer, and
   a NAND-type flash memory device is formed in the first semiconductor pillar.

7. The pillar-shaped semiconductor memory device according to claim 6,
   wherein the at least one stacked material layer comprises a plurality of stacked material layers,
   the pillar-shaped semiconductor memory device includes
   a second gate insulating layer formed below the stacked material layers and surrounding an outer periphery of the first semiconductor pillar,
   a third conductor layer surrounding an outer periphery of the second gate insulating layer, and
   a second impurity region formed below the stacked material layers and in a bottom portion of the first semiconductor pillar and having the same conductivity type as the first impurity region, and
   the NAND-type flash memory device is formed in the first semiconductor pillar in which
   the third conductor layer is connected to the source-side selection gate wiring metal layer,
   the second impurity region is connected to the common source line metal layer,
   the second conductor layer is connected to the drain-side selection gate wiring metal layer, and
   the first impurity region is connected to the bit-line wiring metal layer.

8. The pillar-shaped semiconductor memory device according to claim 1, wherein the side surface of the at least one stacked material layer is not in contact with but is separated from a side surface of the first interlayer insulating layer, the side surface facing the side surface of the at least one stacked material layer.

9. The pillar-shaped semiconductor memory device according to claim 6, further comprising:
   a first outer peripheral semiconductor region formed in an outer periphery of a memory element region in which the first semiconductor pillar is formed so that a height of an upper surface of the first outer peripheral semiconductor region is substantially equal to a height of a top portion of the first semiconductor pillar;
   a second semiconductor pillar which is formed in a second outer peripheral semiconductor region included in the first outer peripheral semiconductor region, whose top portion has a height substantially equal to that of the top portion of the first semiconductor pillar, and whose bottom surface has a height substantially equal to that of a bottom surface of the second conductor layer;

a third gate insulating layer surrounding an outer peripheral portion of the second semiconductor pillar;

a fourth conductor layer which is formed so as to surround an outer periphery of the third gate insulating layer, and whose upper and lower ends have heights substantially equal to those of upper and lower ends of the second conductor layer;

a third impurity region formed above the fourth conductor layer and in a top portion of the second semiconductor pillar and containing a donor or acceptor impurity; and a fourth impurity region formed below the fourth conductor layer and in a bottom portion of the second semiconductor pillar and having the same conductivity type as the third impurity region, wherein a surrounding gate MOS transistor (SGT) is formed in which when one of the third impurity region and the fourth impurity region functions as a source, the other functions as a drain, the second semiconductor pillar disposed between the third impurity region and the fourth impurity region functions as a channel, and the fourth conductor layer functions as a gate.

10. The pillar-shaped semiconductor memory device according to claim 9, further comprising:

a fourth interlayer insulating layer that is formed on the semiconductor substrate so as to surround the outer periphery of the first semiconductor pillar, and that extends to a side surface and an upper surface of the first outer peripheral semiconductor region; and a contact hole connected to an upper surface of the first conductor layer of one of the stacked material layers that have an upper surface on an upper end of a side surface of the first outer peripheral semiconductor region, wherein the stacked material layers are formed on the fourth interlayer insulating layer, the upper surface of the stacked material layers has a height substantially equal to that of an upper surface of the fourth interlayer insulating layer located on the first outer peripheral semiconductor region, and the first conductor layer and the word-line wiring metal layer are connected to each other through the contact hole.

11. A method for producing a pillar-shaped semiconductor memory device, the method comprising:

a mask insulating layer-forming step of forming, on a semiconductor substrate, a mask insulating layer having a circular shape in plan view;

a first semiconductor pillar-forming step of etching the semiconductor substrate using the mask insulating layer as a mask to form a semiconductor pillar on the semiconductor substrate, and retracting a side surface of the semiconductor pillar inward in a radial direction of the semiconductor pillar to form a first semiconductor pillar;

a tunnel insulating layer-forming step of forming a tunnel insulating layer so as to surround an outer periphery of the first semiconductor pillar;

a data charge storage insulating layer-forming step of forming a data charge storage insulating layer so as to surround an outer periphery of the tunnel insulating layer;

a first interlayer insulating layer-forming step of forming a first interlayer insulating layer so as to surround an outer periphery of the data charge storage insulating layer;

a first conductor layer-forming step of forming a first conductor layer on an outer periphery of the first semiconductor pillar and above the semiconductor substrate by allowing a material atom to be incident in a direction perpendicular to an upper surface of the mask insulating layer;

a third interlayer insulating layer-forming step of forming a third interlayer insulating layer on the outer periphery of the first semiconductor pillar and above the semiconductor substrate by allowing a material atom to be incident on the first conductor layer in a direction perpendicular to the upper surface of the mask insulating layer;

a stacked material layer-forming step of forming at least one stacked material layer in a direction perpendicular to an upper surface of the semiconductor substrate, the stacked material layer including the first conductor layer and the third interlayer insulating layer as one set; and a second interlayer insulating layer-forming step of forming a second interlayer insulating layer in a space formed between a side surface of the first interlayer insulating layer and side surfaces of the first conductor layer and the third interlayer insulating layer, wherein data writing and erasing due to a data charge transfer between the first semiconductor pillar and the data charge storage insulating layer through the tunnel insulating layer or data charge retention by the data charge storage insulating layer is performed by application of a voltage to the first conductor layer.

12. The method according to claim 11, wherein the second interlayer insulating layer formed on the side surface of the first interlayer insulating layer is formed so as to extend to an upper surface of an uppermost layer of the at least one stacked material layer.

13. The method according to claim 12, wherein the second interlayer insulating layer is formed so that a thickness of the second interlayer insulating layer on the upper surface of the uppermost layer of the at least one stacked material layer is larger than ½ of a thickness of the second interlayer insulating layer in contact with the first interlayer insulating layer.

14. The method according to claim 11, wherein, after the stacked material layer-forming step, heat treatment is performed in an atmosphere containing hydrogen.

15. The method according to claim 11, further comprising:

after the stacked material layer-forming step, forming an oxide insulating layer in a surface layer of a side surface of the first conductor layer by performing heat treatment in an atmosphere containing oxygen.

16. The method according to claim 11, comprising:

a truncated cone-shaped mask insulating layer-forming step of forming, instead of the mask insulating layer, a truncated cone-shaped mask insulating layer on the first semiconductor pillar; and a cone-shaped stacked material layer-forming step of depositing a material atom by allowing the material atom to be incident in a direction perpendicular to the upper surface of the semiconductor substrate under a condition in which a deposition rate of the material atom on a side surface of the truncated cone-shaped mask insulating layer is lower than a removal rate of the material atom to form the at least one stacked material layer above the semiconductor substrate and to form, on the truncated cone-shaped mask insulating layer, a cone-shaped stacked material layer formed of the same material as the at least one stacked material layer.

17. The method according to claim 11, further comprising:
- a first gate insulating layer-forming step of forming a first gate insulating layer above the at least one stacked material layer so as to surround the outer periphery of the first semiconductor pillar;
- a second conductor layer-forming step of forming a second conductor layer so as to surround an outer periphery of the first gate insulating layer;
- a first impurity region-forming step of forming a first impurity region in a top portion of the first semiconductor pillar, the first impurity region containing a donor or acceptor impurity;
- a second gate insulating layer-forming step of forming a second gate insulating layer below the at least one stacked material layer so as to surround the outer periphery of the first semiconductor pillar;
- a third conductor layer-forming step of forming a third conductor layer so as to surround an outer periphery of the second gate insulating layer;
- a step of connecting the first conductor layer of the at least one stacked material layer to a word-line wiring metal layer;
- a step of connecting the second conductor layer to a source-side selection gate wiring metal layer or a drain-side selection gate wiring metal layer; and
- a step of connecting the first impurity region to a common source line metal layer or a bit-line wiring metal layer.

18. The method according to claim 17, comprising:
- a second gate insulating layer-forming step of forming a second gate insulating layer below the at least one stacked material layer so as to surround the outer periphery of the first semiconductor pillar;
- a third conductor layer-forming step of forming a third conductor layer so as to surround an outer periphery of the second gate insulating layer; and
- a second impurity region-forming step of forming a second impurity region below the third conductor layer and in a bottom portion of the first semiconductor pillar, the second impurity region having the same conductivity type as the first impurity region,
- wherein the first conductor layer of the at least one stacked material layer is connected to the word-line wiring metal layer,
- the third conductor layer is connected to the source-side selection gate wiring metal layer,
- the second impurity region is connected to the common source line metal layer,
- the second conductor layer is connected to the drain-side selection gate wiring metal layer, and
- the first impurity region is connected to the bit-line wiring metal layer to form a NAND-type flash memory device in the first semiconductor pillar.

19. The method according to claim 17, further comprising:
- a first outer peripheral semiconductor region-forming step of forming, in an outer periphery of a memory element region in which the first semiconductor pillar is formed, a first outer peripheral semiconductor region whose upper surface has a height substantially equal to a height of a top portion of the first semiconductor pillar;
- a second semiconductor pillar-forming step of forming, in a second outer peripheral semiconductor region included in the first outer peripheral semiconductor region, a second semiconductor pillar whose top portion has a height substantially equal to that of the top portion of the first semiconductor pillar, and whose bottom surface has a height substantially equal to that of a bottom surface of the second conductor layer;
- a third gate insulating layer-forming step of forming a third gate insulating layer so as to surround an outer periphery of the second semiconductor pillar;
- a fourth conductor layer-forming step of forming a fourth conductor layer whose upper and lower ends have heights substantially equal to those of upper and lower ends of the second conductor layer in a direction perpendicular to the semiconductor substrate so as to surround an outer periphery of the third gate insulating layer;
- a third impurity region-forming step of forming a third impurity region above the fourth conductor layer and in a top portion of the second semiconductor pillar, the third impurity region containing a donor or acceptor impurity; and
- a fourth impurity region-forming step of forming a fourth impurity region below the fourth conductor layer and in a bottom portion of the second semiconductor pillar, the fourth impurity region having the same conductivity type as the third impurity region,
- wherein a surrounding gate MOS transistor (SGT) is formed in which when one of the third impurity region and the fourth impurity region functions as a source, the other functions as a drain, the second semiconductor pillar disposed between the third impurity region and the fourth impurity region functions as a channel, and the fourth conductor layer function as a gate.

20. The method according to claim 19, further comprising:
- a fourth interlayer insulating layer-forming step of forming a fourth interlayer insulating layer on the first outer peripheral semiconductor region, on a side surface of the first outer peripheral semiconductor region, and on the semiconductor substrate in the outer periphery of the first semiconductor pillar disposed in the memory element region; and
- a contact hole-forming step of forming a contact hole connected to an upper surface of the first conductor layer,
- wherein the at least one stacked material layer is formed on the fourth interlayer insulating layer so as to surround the outer periphery of the first semiconductor pillar and to extend to the side surface of the first outer peripheral semiconductor region,
- the at least one stacked material layer is formed such that the upper surface of the at least one stacked material layer has a height substantially equal to that of an upper surface of the fourth interlayer insulating layer located on the first outer peripheral semiconductor region, and
- the first conductor layer and the word-line wiring metal layer are connected to each other through the contact hole.

* * * * *